United States Patent [19]
Burke et al.

[11] Patent Number: 5,333,176
[45] Date of Patent: Jul. 26, 1994

[54] CELLULAR HAND HELD PORTABLE SPEAKERPHONE SYSTEM HAVING AN INTERFACE ADAPTER

[75] Inventors: Timothy M. Burke; Yoshihiro Kinoshita, both of Plano, Tex.; Takashi Nakano, Shiga, Japan; Thomas K. Brown; Toshiharu Fukuma, both of Plano, Tex.; Yoji Tsujishita, Kyoto, Japan

[73] Assignee: Murata Machinery, Ltd., Kyoto, Japan

[21] Appl. No.: 96,549

[22] Filed: Jul. 26, 1993

Related U.S. Application Data

[63] Continuation-in-part of Ser. No. 876,102, Apr. 30, 1992, Pat. No. 5,248,989.

[51] Int. Cl.[5] ............................................. H04M 11/00
[52] U.S. Cl. .................................... 379/58; 379/59; 455/90
[58] Field of Search .................. 379/58, 59, 420, 432, 379/450, 56; 455/89, 90, 126

[56] References Cited

U.S. PATENT DOCUMENTS

| | | | |
|---|---|---|---|
| 4,636,741 | 1/1987 | Mitzlaff | 455/126 |
| 4,845,738 | 7/1989 | Takano | 455/90 |
| 4,876,740 | 10/1989 | Levine et al. | 379/59 |
| 5,003,576 | 3/1991 | Helferich | 379/56 |
| 5,014,294 | 5/1991 | Kromenaker et al. | 379/58 |
| 5,136,229 | 8/1992 | Galvin | 379/61 |
| 5,142,573 | 8/1992 | Umezawa | 455/90 |

Primary Examiner—Curtis Kuntz
Assistant Examiner—Michael B. Chernoff
Attorney, Agent, or Firm—Spensley Horn Jubas & Lubitz

[57] ABSTRACT

A hand held cellular telephone system including voice storage features which enable the cellular telephone to perform functions similar to a telephone answering device, a battery monitoring system for providing the user with a real time display of the amount of time remaining for use of the cellular telephone in both the standby and conversation modes, and an interface adapter which may be used to provide speakerphone functions, power the cellular telephone, and recharge the battery.

1 Claim, 22 Drawing Sheets

| address | 0350H | 0351H | 0352H | 0353H | 0354H | 0355H | 0356H | 0357H | 0358H | 0359H | 035AH | 035BH | 035CH | 035DH | 035EH | 035FH | 0340H | 0341H | 0342H | 0343H | 0344H | 0345H | 0346H | 0347H |
|---|---|---|---|---|---|---|---|---|---|---|---|---|---|---|---|---|---|---|---|---|---|---|---|---|
| data D0 | TCSR0 | TTA0 | TRT0 | TRT8 | TRT0 | TTSM0 | VINT | | TRID8 | TRID0 | TR2D8 | TR2D0 | MAHO | MAHO | | | | | BANK0 | PRO0 | MASK(0) | LOAD |
| data D1 | TCSR1 | TTA1 | TRT9 | TRT1 | TTSM1 | MPNC0 | | TRID9 | TRID1 | TR2D9 | TR2D1 | TR1 FULL | TR1 FULL | | | | | BANK1 | PRO1 | CLKEN(1) | TEST1 |
| data D2 | TCSR2 | TTA2 | TRT10 | TRT2 | TTSM2 | MPNC1 | | TRID10 | TRID2 | TR2D10 | TR2D2 | TR2 FULL | TR2 FULL | | | | | BANK2 | PRO2 | STATUS* | TESTS2 |
| data D3 | TCSR3 | TTA3 | TRT11 | TRT3 | | MPNC2 | | TRID11 | TRID3 | TR2D11 | TR2D3 | EOFTX | EOFTX | | | | | | PRO3 | FLAG* | |
| data D4 | TCSR4 | TTA4 | TRT12 | TRT4 | | MPNC3 | | TRID12 | TRID4 | TR2D12 | TR2D4 | RTC | RTC | | | | | | PRO4 | NC* | |
| data D5 | TCSR5 | TTA5 | TRT13 | TRT5 | | MPNC4 | | TRID13 | TRID5 | TR2D13 | TR2D5 | SOFTN | SOFT | | | | | | PRO5 | | |
| data D6 | TCSR6 | TTA6 | TRT14 | TRT6 | | MPNC5 | | TRID14 | TRID6 | TR2D14 | TR2D6 | TXEMP | | | | | | EXTN | PRO6 | | |
| data D7 | TCSR7 | TTA7 | TRT15 | TRT7 | | | | TRID15 | TRID7 | TR2D15 | TR2D7 | | | | | | | | PRO7 | | |
| read or write | read/ write | read/ write | read/ write | read/ write | read/ write | write | read | read/ write | read | read | read | read | read/ write | read/ write | | | | read/ write | read/ write | read/ write | read/ write | write |
| comments | trans. channel select reg. | TDM trans. addr. reg. 1 | TDM trans. DATA reg. 1 | TDM trans. DATA reg. 2 | int. TX EMPTY clear | int. VOICE DSP | trans. channel number monitor | int. MAHO clear | TDM data reg. 1 addr.* | TDM data reg. 1 data | TDM data reg. 2 addr.* | TDM data reg. 2 data | int. mask reg. | int. mask reg. | LCD contr. instr. code | LCD contr. DATA | NOT USED | NOT USED | BANK CHANGE | protect | battery mgr. | ASC TEST PORT HC11 must not access this port |
| ACTIVE | HIGH | HIGH | HIGH | HIGH | HIGH | LOW | | HIGH | | | | | HIGH | HIGH LOW | | | | | | | HIGH | |
| RESET | 00H | 00H | 00H | 00H | 00H | 0FH | 00H | 00H | 40H | 00H | 40H | 00H | 00H | 00H | 00H | 00H | | | 00H | 00H | 00H | |
| port name | CSW0 | CSW1 | CSW2 | CSW3 | CSW4 | CSW5 | | CSW6 | | | | | CSW7 | | | | | | CSW8 | CSW9 | CSW10 | CSW11 |

* = READ ONLY

Figure 3E

| address | | port D | port E |
|---|---|---|---|
| data | D0 | | MAHO |
| | D1 | | ATTS |
| | D2 | | RXEN |
| | D3 | | CLKDES |
| | D4 | | RCEN |
| | D5 | | |
| | D6 | | |
| | D7 | | |
| | D8 | | |
| | D9 | | |
| read or write | | write | write |
| comments | | watch dog tImer clear | baseband DSP output port |
| active | | | |
| reset | | | 05H |
| port name | | | |

Figure 3g

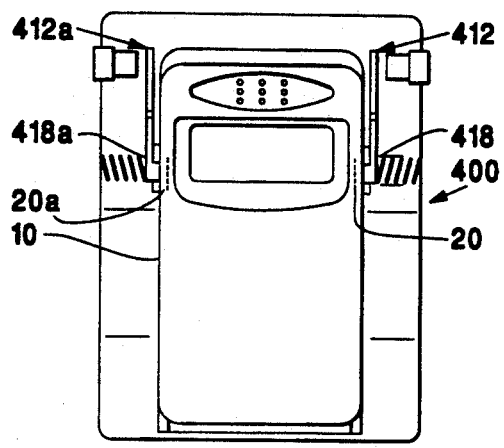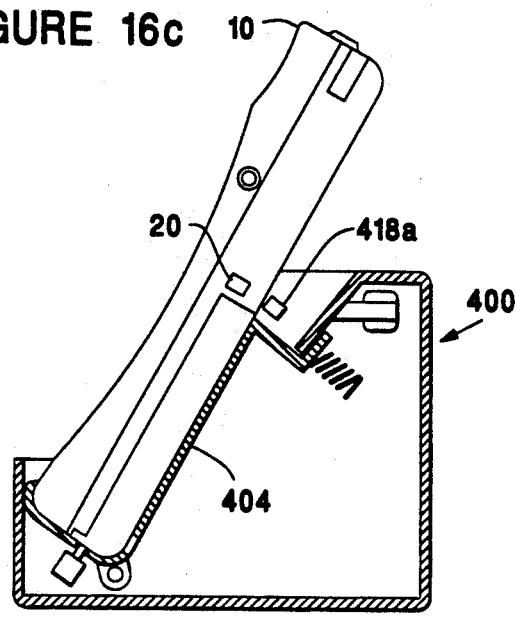
FIGURE 16b
FIGURE 16c
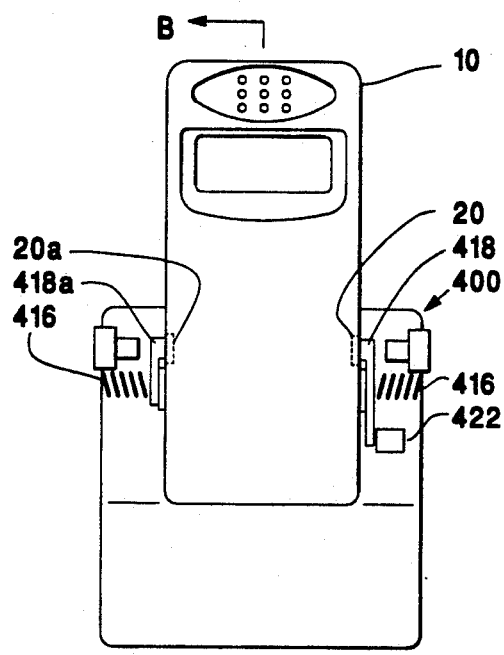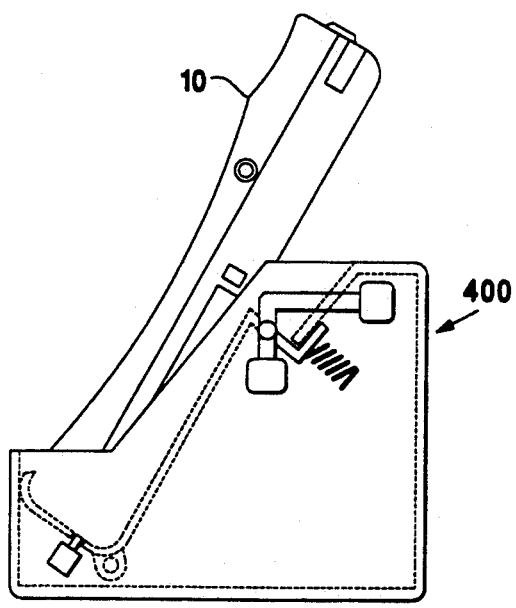
FIGURE 16a
FIGURE 16d

CELLULAR HAND HELD PORTABLE SPEAKERPHONE SYSTEM HAVING AN INTERFACE ADAPTER

This application is a continuation-in-part of U.S. application Ser. No. 07/876,102, filed Apr. 30, 1992 now U.S. Pat. No. 5,248,989.

BACKGROUND OF THE INVENTION

1. Field of the Invention

The present invention is directed to a cellular hand held portable speakerphone system.

2. Description of Related Art

Cellular telephones are rapidly becoming commonplace. Indeed, in many fields a cellular telephone is almost a necessity. As cellular telephone technology advances, the size of cellular telephones is constantly shrinking to the point where cellular telephones can fit in the palm of the hand or a shirt pocket. There are, however, a number of problems associated with prior art cellular telephones.

For example, prior art cellular telephones which are designed for use outside the vehicle environment do not operate in a speakerphone mode. As such, the user's hands are not free during use. Moreover, standard telephones and vehicular cellular telephones which are designed to operate in a speakerphone mode suffer from a number of disadvantages. For example, acoustic coupling between the loudspeaker and the microphone causes a number of undesirable effects. Incoming speech at the speakerphone end is fed back from the loudspeaker to the microphone through an acoustic path and transmitted to the distant party with a delay. This is a form of "talker echo." Also, the distant party is subject to "listener echo." Another common speakerphone problem relates to the gain which is required in both the transmitting and receiving paths to make up for the loss introduced by moving the telephone away from the user's head. Signals from the microphone reach the loudspeaker via a sidetone path and come back to the microphone through the acoustic coupling described above, thus forming a loop. Too much gain in this loop causes "singing." One proposed solution to the "echo" and "singing" problems is a voice operated switching device which only allows one direction of transmission to be fully operative at a time. However, prior art switching devices detract from the naturalness of the conversation.

Another problem related to prior art cellular telephones is that they do not have recording capabilities. Thus, if the user is away from the cellular telephone when a call comes in, the calling party cannot leave a message.

Further problems are related to the fact that prior art cellular telephones are primarily designed to operate on battery power. When the battery is fully discharged in a prior art cellular telephone, the discharged battery must be removed and replaced with a charged spare battery. If a spare battery is unavailable, then the cellular telephone will be useless until the present battery has been re-charged.

Moreover, while many cellular telephones provide an indication of the battery charge state and/or level, it is difficult for the user of a cellular telephone to convert the indication of the state of the battery into meaningful information (e.g. such as whether the battery charge state is sufficient to allow the user of the telephone to make an additional cellular telephone call, to determine the length of the call that can be made, or to determine the amount of time remaining that the user can receive calls). If the battery level approaches full discharge while the cellular telephone is in use, then the user must alert the other party to this fact, hang up, replace the discharged battery with a spare (if available), and again call the other party. Such a procedure is extremely inconvenient.

SUMMARY OF THE INVENTION

It is an object of the present invention to provide a hand held cellular telephone system which obviates, for practical purposes, the aforementioned problems associated with the prior art.

In accordance with one aspect of the present invention, the cellular telephone may include a digital signal processor that performs an improved voice switching operation which provides acoustic echo suppression when in the speakerphone mode.

In accordance with another aspect of the present invention, the hand held cellular telephone provides speech recording and playback features which enable the cellular telephone to operate in a manner similar to a telephone answering device.

In accordance with a further aspect of the present invention, the cellular telephone may include a battery time monitor which provides a visual feedback to the phone user of the remaining battery capacity by displaying the amount of time remaining for operation. The real time display may provide the user with the remaining operation time for both a standby mode and conversation mode of operation for the cellular telephone. By providing a real time display of the remaining operation time for the cellular telephone (standby and conversation), the user of the cellular telephone can instantly know not only the status of the battery charge in the cellular telephone but how long the next call can last before the battery discharges.

In accordance with a still further aspect of the present invention, the hand held portable cellular telephone system may include an interface adapter and battery pack system which provides a number of advantageous features. First, the interface adapter may provide power for the cellular telephone as well as speakerphone capability when the cellular telephone is mounted therein. Thus, the cellular telephone may be used when its battery is completely discharged and no spare is available. Additionally, the battery may be charged while the cellular telephone is being used in the speakerphone mode.

In accordance with a still further aspect of the present invention, the power supply to the cellular telephone phone may be switched from the interface adapter to the battery pack without any interruption in the supply of power to the telephone. The cellular telephone may, therefore, be placed in or removed from the interface adapter while a call is in progress without interrupting the call.

BRIEF DESCRIPTION OF THE DRAWINGS

A detailed description of the preferred embodiment of the invention will be made with reference to the accompanying drawings.

FIG. 3e illustrates one example of a microprocessor address map in accordance with the preferred embodiment illustrated in FIG. 3.

FIG. 3g illustrates a baseband DSP I/O map in accordance with the preferred embodiment illustrated in FIG. 3.

FIG. 15b is a top view of the interface adapter illustrated in FIG. 15a.

FIG. 15c is a section view taken along line A—A in FIG. 15a.

FIG. 15d is a side elevation view of the interface adapter illustrated in FIG. 15a.

FIG. 16a is a front elevation view of the interface adapter illustrated in FIG. 15a having a cellular telephone mounted therein in an "unlocked" position.

FIG. 16b is a top view of the interface adapter and cellular telephone illustrated in FIG. 16a.

FIG. 16c is a section view taken along line B—B in FIG. 16a.

FIG. 16d is a side elevation view of the interface adapter and cellular telephone illustrated in FIG. 16a.

FIG. 17b is a top view of the interface adapter and cellular telephone illustrated in FIG. 17a.

FIG. 17c is a section view taken along line C—C in FIG. 17a.

FIG. 17d is a side elevation view of the interface adapter and cellular telephone illustrated in FIG. 17a.

DESCRIPTION OF THE PREFERRED EMBODIMENT

The following is a detailed description of the best presently known mode of carrying out the invention. This description is not to be taken in a limiting sense, but is made merely for the purpose of illustrating the general principles of the invention. The scope of the invention is defined by the appended claims.

Figure 1:
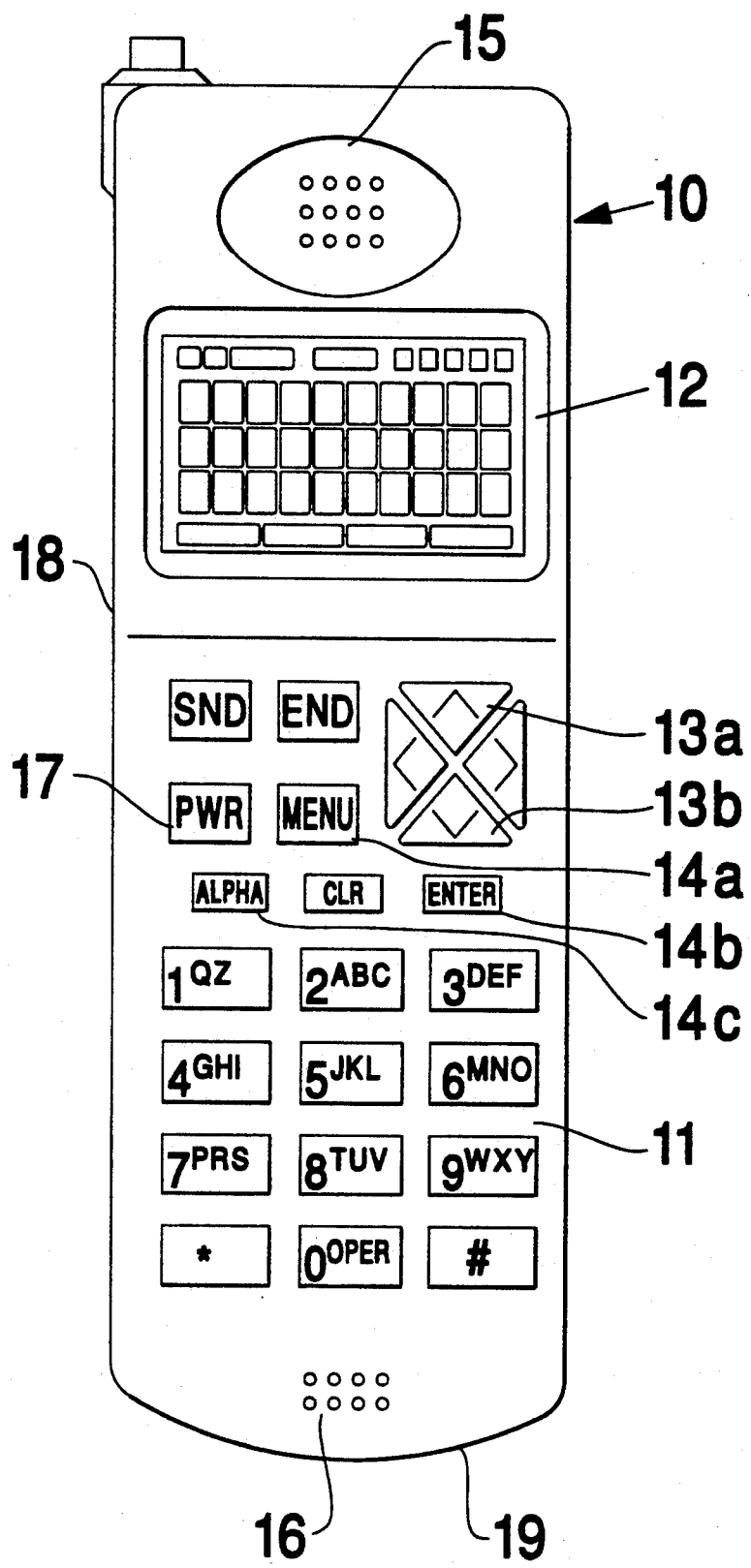
FIG. 1 illustrates a hand held cellular telephone in accordance with the preferred embodiment of the present invention.

FIG. 1 shows a hand held cellular telephone 10 having a keypad 11 including numeric keys, * and # keys, and a number of miscellaneous keys 14a-14c which may be depressed to initiate voice storage functions such as message record and playback, and other functions such as send, end, etc. as known in the art. An LCD display 12 may be used to display the time and date, the number dialed, the battery status, appointments, and other information. Scroll keys 13a and 13b may function in a manner similar to that described in U.S. patent application No. 07/876,103, entitled PC-LINK FOR CELLULAR TELEPHONE which was filed on Apr. 30, 1992 and which is incorporated herein by reference in its entirety. A connector (not shown) may be provided for connection to an RS-232 serial interface. The cellular telephone 10 may also include an earpiece 15, a microphone 16, a power on/off switch 17, and a volume control switch 18. The cellular telephone may operate in both analog and digital modes. Such modes of operation, as well as the circuitry of cellular telephone 10, are described in greater detail below.

Figure 2:
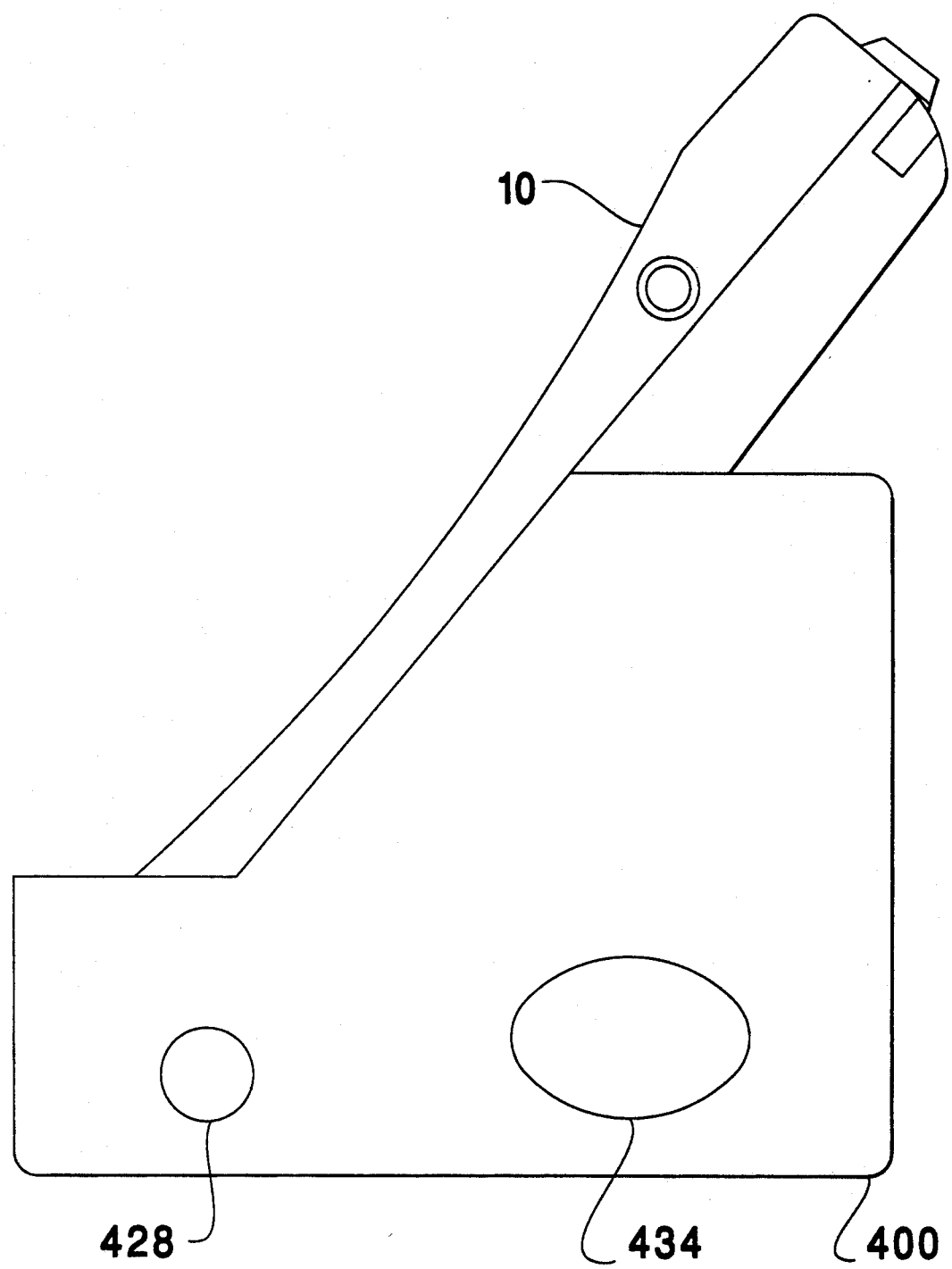
FIG. 2 illustrates a hand held cellular telephone mounted in an interface adapter in accordance with the preferred embodiment of the present invention.

As illustrated for example in FIG. 2, the hand held cellular telephone 10 may be placed in an interface adapter 400 designed for desktop use. The cellular telephone 10 may also be placed in a similar interface adapter designed for vehicular use. The desktop interface adapter 400 may include a speaker 434 and a microphone 428 which may be utilized in conjunction with the cellular telephone 10 to perform speakerphone functions. The vehicle interface adapter may also be similarly equipped and perform similar functions. The desktop and vehicle interface adapters may be used to supply power to the cellular telephone 10 and to charge the telephone's battery. The interface adapter, as well as the speakerphone, power supply, and charging functions, are described in greater detail below.

CIRCUITRY

Figure 3:
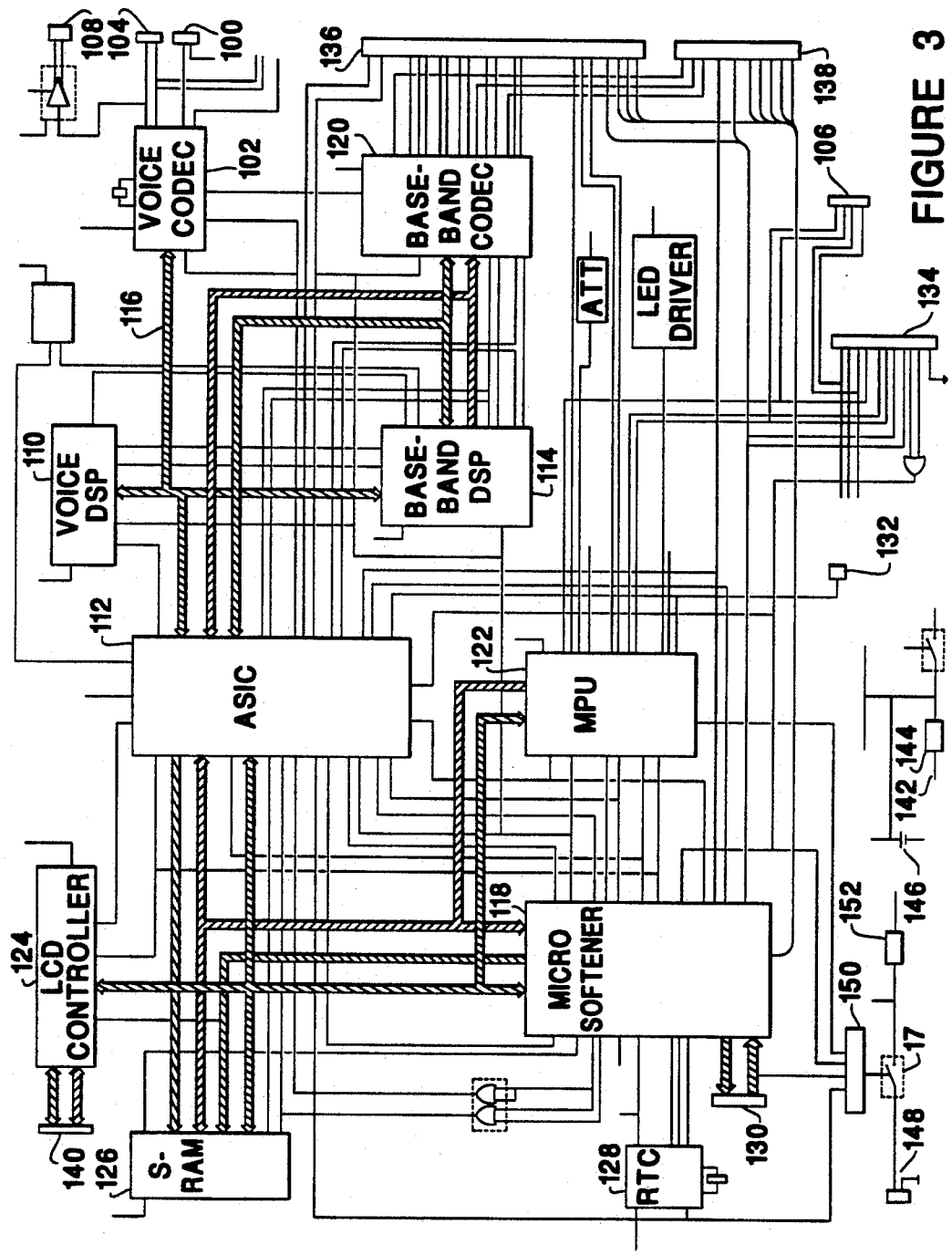
FIG. 3 illustrates a logic board in accordance with the preferred embodiment of present invention.
Figure 6:
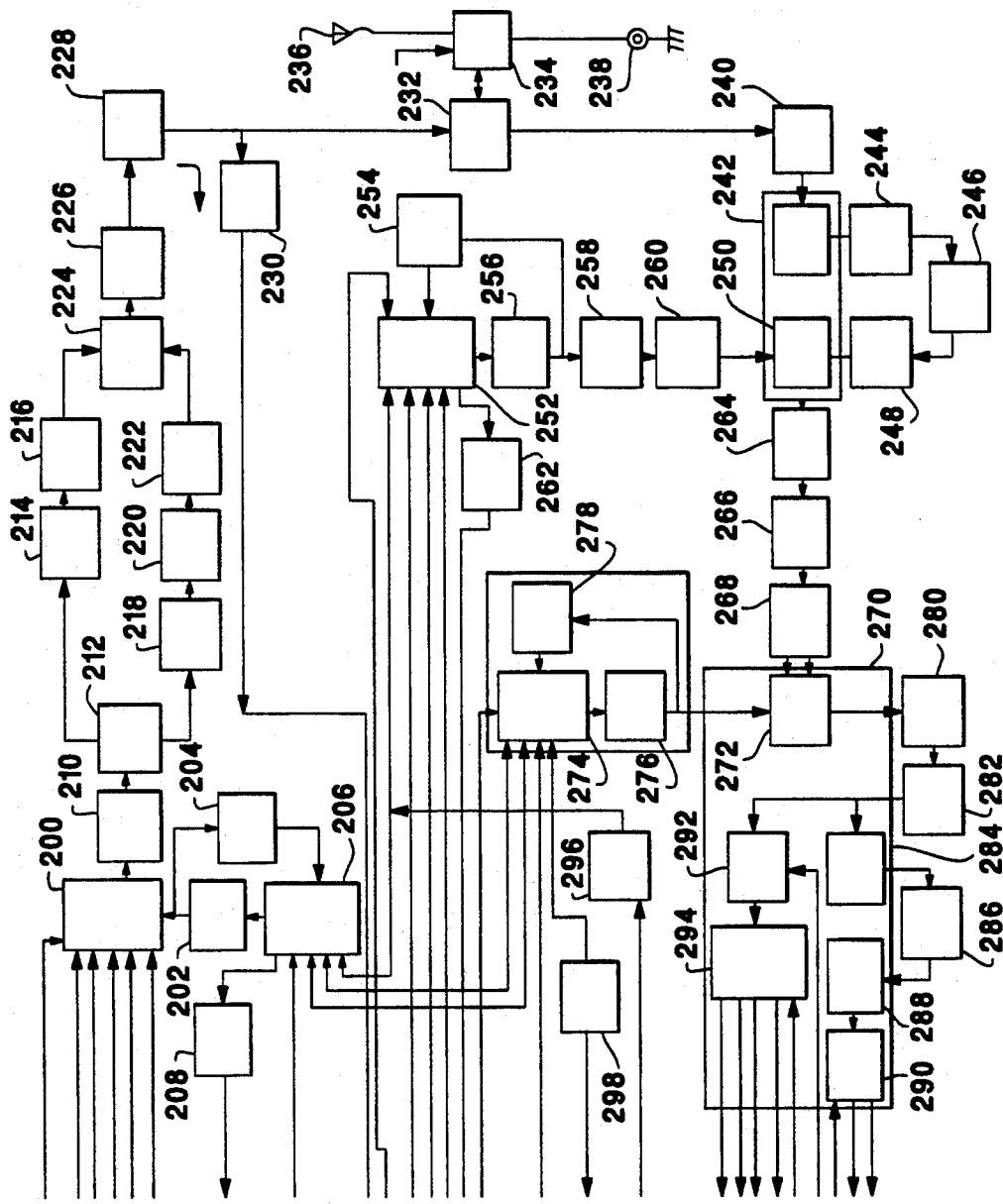
FIG. 6 illustrates a radio frequency board in accordance with the referred embodiment of the present invention.

In accordance with the preferred embodiment, the cellular telephone circuitry may be divided generally into two boards, a logic board, which is illustrated for example in FIG. 3, and a radio frequency (RF) board, which is illustrated for example in FIG. 6. The RF board provides traditional FM transmit/receive functions which are used in existing cellular telephones. The RF board also provides a linear transmitter/receiver that is used for the pi/4 differential quadrature phase shift-keyed (QPSK) modulation used in North American time division multiple access (TDMA) transmission. The preferred embodiment performs essentially all of the audio processing and signalling functions digitally, including A/D and D/A conversion of voice input and output signals, respectively.

A. The Logic Board

As illustrated for example in FIG. 3, a four wire time division multiplication (TDM) bus 116 may be connected to an application specific integrated circuit (ASIC) 112. The ASIC 112 provides an interface for the TDM bus 116 which may be connected to a microprocessor 122, preferably a Motorola 68HC11 microprocessor, and other portions of the logic board. The ASIC 112 performs a data format conversion function (serial/parallel and parallel/serial) which enables data transfer between a serial port connected to the TDM bus 116 and the microprocessor 122 which has a parallel format. The microprocessor 122 performs all of the control functions for the cellular telephone 10. Such control functions include user interface functions such as driving an LCD controller 124. The LCD controller sends signals to the LCD display through a LCD display connector 140. The user interface functions also include monitoring key signals which are received from the various keys through a keyboard connector 130. The control functions also include call processing, voice storage, digital signal processor (DSP) control, and RF control. A memory map and an address map for the microprocessor 122 are respectively illustrated in FIGS. 3d and 3e and are discussed below in Section C with reference to the ASIC 112.

In accordance with the preferred embodiment, a microsoftener 118, preferably a Dallas Semiconductor DS5311, may be used as a port expander to provide additional I/O ports for the microprocessor 122. The microsoftener 118 may also include a resident "bootstrap program" which may be used to load programs used by the microprocessor 122. In such a loading operation, the microsoftener 118 uses a serial port 134 to receive information from an external device. The control program is then downloaded into a static RAM 126 which provides both read only memory (ROM) and read/write memory (RAM). The static RAM 126 may also be used to store compressed speech data and data such as telephone numbers, appointments, etc. The operating program operates out of the ROM and the data operates out of the RAM. The ROM and RAM may be portions of a single device.

The microsoftener 118 may also control the battery backup functions which are provided to insure that the static RAM 126 does not lose memory when the cellular phone is turned off. While the cellular phone is operating, a 6 V source 142, which is regulated by a regulator 144, provides power to the static RAM 126. When the cellular phone is turned off, the static RAM 126 is switched over to a 3 V battery 146, preferably a lithium battery, which is used for memory retention.

A real time clock (RTC) 128 may be connected to microsoftener 118. The RTC 128 provides time and date information. The time and date information may be displayed by the LCD display 12. Additionally, the time and date information may be used in conjunction with appointments data to alert a user that he or she has an appointment on that day. Thus, the cellular telephone 10 may be used as a "pocket secretary."

The logic board may be connected to a battery (described below) by a connector 148 and the power on/off switch 17. The power on/off switch 17 may be connected to a power switch controller 150. The power switch controller 150 may be connected to the keyboard connector 130. Thus, the power switch controller 150 may be used to turn on the power on/off switch in response to the depression of any one of the keys by a user. The power switch controller 150 may also be connected to the ASIC 112, the microsoftener 118, the microprocessor 112 and the RTC 128. Thus, if an appointment consists of a telephone call, the power switch controller 150 may be used to turn on the cellular phone 10 at a predetermined date and time. At such time, the user may be signaled by a "beep" and the appropriate telephone number may be automatically dialed. Also connected to the power on/off switch 150 is a voltage regulator 152.

As illustrated for example in FIG. 3, analog signals enter the logic board through a microphone connector 100 and are converted from analog to digital form by a voice coder/decoder (voice codec) 102, preferably an AT&T CSP1027. The voice codec 102 may be connected to the TDM bus 116. The voice codec 102 includes A/D and D/A converters and provides a digital representation of the analog signal from a microphone. Similarly, digital signals which are to be output through a speaker connector 104 are first converted to analog by the voice codec 102. The voice codec 102 may also be connected to an external connector 106, which may be connected to either the vehicle interface adapter or the desktop interface adapter, and an alarm connector 108.

A baseband digital signal processor (baseband DSP) 114 including A/D and D/A converters, preferably a Texas Instruments TMS320C53, may also be connected to the TDM bus 116. The baseband DSP 114 performs advanced mobile phone service (AMPS) analog functions. These functions include filtering and commanding an audio signal from the microphone, deviation control, frequency-shift key (FSK) signalling, SAT supervisory tone signalling for link control, and FM modulation before the signal is sent to the RF board. The baseband DSP 114 also performs all of the TDM access functions, such as data reception, equalizer detection, channel forward error correction (FEC) decoding and encoding, and burst generation.

A voice digital signal processor (voice DSP) 110, preferably a Texas Instruments TMS320C53, may be connected to the TDM bus 116. The primary function of the voice DSP 110 is to provide Vector Sum Excited Linear Predictive (VSELP) speech compression in conjunction with the voice codec 102 and the baseband DSP 114 when the cellular telephone is operating in the IS-54 digital mode. Secondary functions of the voice DSP 110 include voice recording and acoustic echo suppression. These functions are described below.

Figure 4:
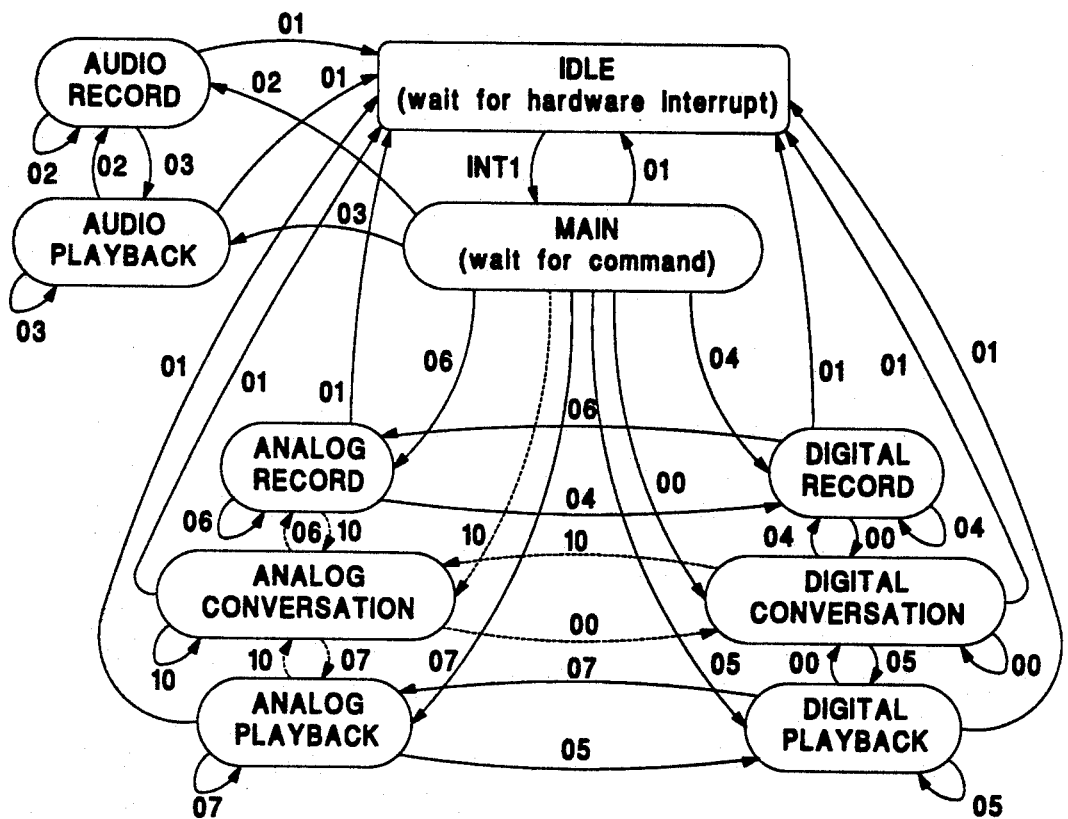
FIG. 4 is a state diagram illustrating the operations of a digital signal processor in accordance with the preferred embodiment of the present invention.

As illustrated for example in FIG. 4, the voice DSP 110 operates as a state machine under the control of the microprocessor 122. The voice DSP 110 will operate in one of a number of states or modes, both analog and digital. These modes are described below with reference to the functions performed in conjunction with each mode.

Figure 5:
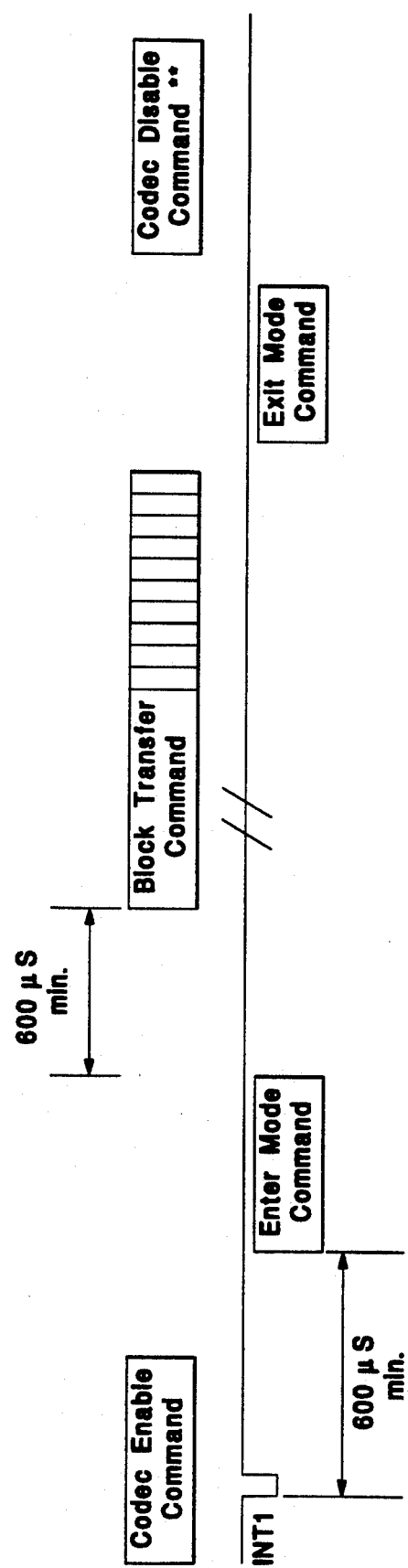
FIG. 5 illustrates a microprocessor command sequence in accordance with the preferred embodiment of the present invention.

In accordance with the preferred embodiment, on power-up the voice DSP 110 will initialize all hardware, wait approximately 5 ms, and then enter a "low-power" idle mode 01. As illustrated for example in FIG. 5, an INT1 line may be set high during the power-up initialization. A hardware interrupt (a brief low pulse) from the microprocessor 122 on the INT1 line of the voice DSP 110 takes the voice DSP out of the idle mode 01 and into a main command mode. In the command mode the voice DSP 110 will wait for commands from the microprocessor 122. Upon command from the microprocessor 122, the voice DSP 110 will enter one of the operating modes and remain in that mode until commanded to change modes by the microprocessor 122. If the voice codec 102 is required for a given operating mode, then the microprocessor 122 will enable the voice codec prior to the interrupt. The interrupt is not required when changing from one mode to another. A current mode terminate command will return the voice DSP 110 to the idle mode 01. FIG. 4 will be further referred to below.

B. The TDM Bus

As discussed above with respect to FIG. 3, the microprocessor 122 may be connected to the TDM bus 116 through the ASIC 112. The TDM bus 116 may operate as an 8-slot system with, for example, the address assignments illustrated in FIG. 3a and the slot assignments illustrated in FIG. 3b. The microprocessor 122 may be fixed in slot 0 because it generates a frame sync signal for the TDM bus 116. The voice codec 102 may be fixed in slot 2. In accordance with the preferred embodiment, the voice DSP 110 and baseband DSP 114 transmit in multiple slots per frame.

Figures 3A, 3B, 3C:
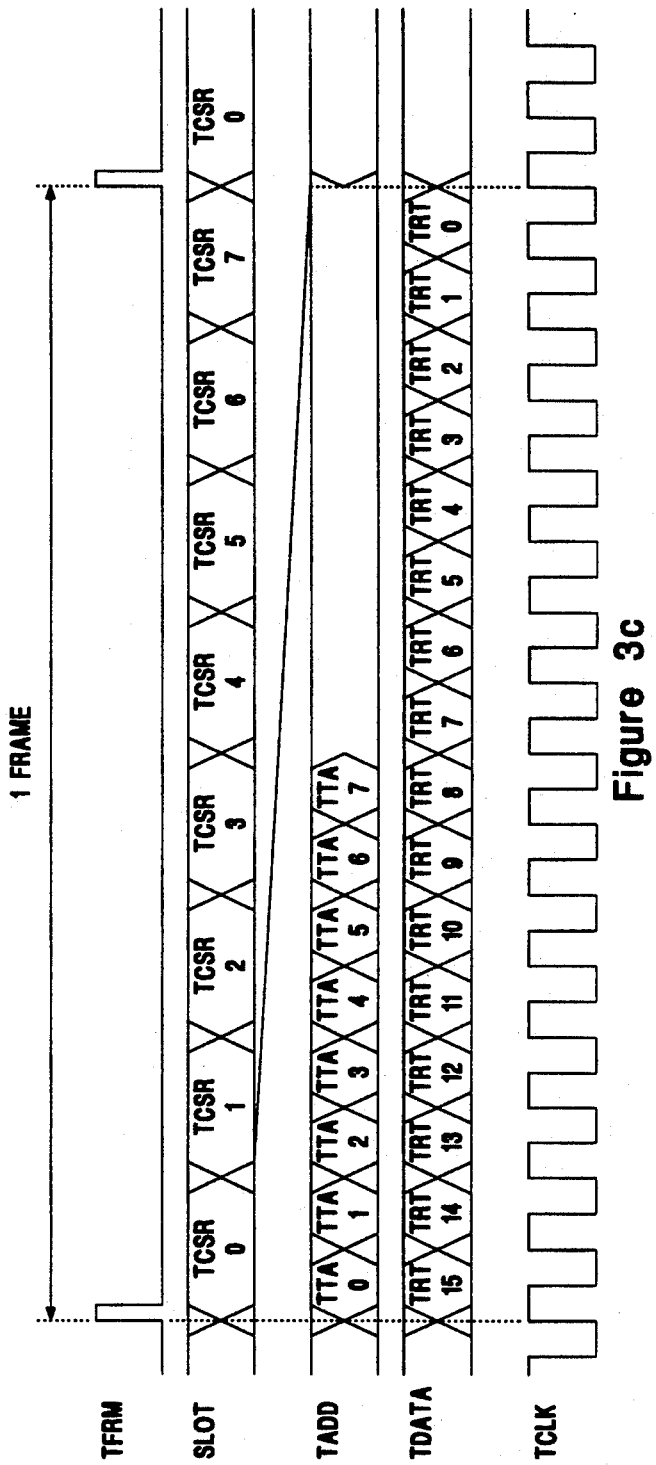
FIG. 3a is a table showing one example TDM bus address assignments in accordance with the preferred embodiment illustrated in FIG. 3.
FIG. 3b illustrates one example of TDM bus slot assignments in accordance with the preferred embodiment illustrated in FIG. 3.
FIG. 3c illustrates one example of data transfer over the TDM bus in accordance with the preferred embodiment illustrated in FIG. 3.
Figure 3D:
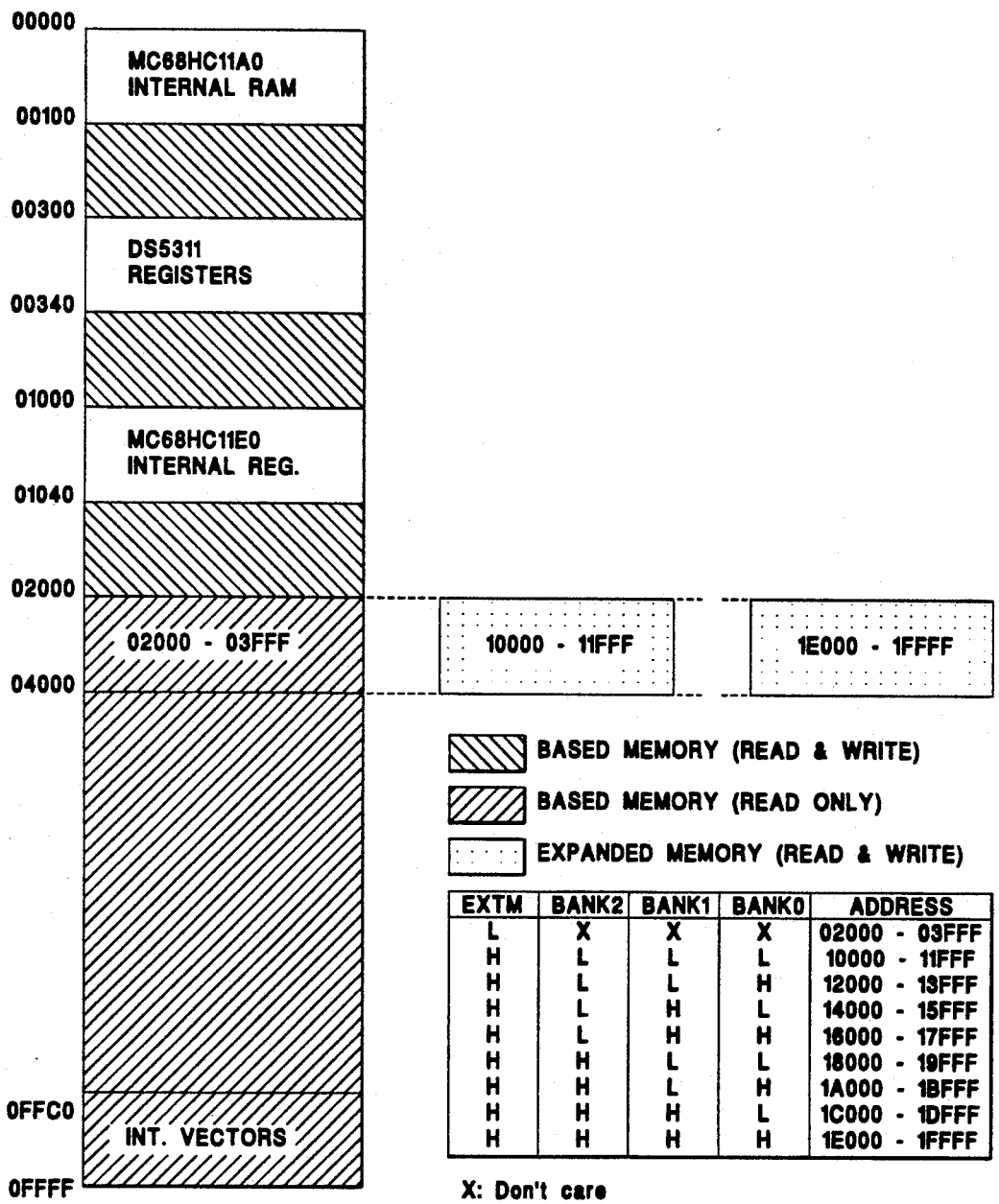
FIG. 3d illustrates one example of a microprocessor memory map in accordance with the preferred embodiment illustrated in FIG. 3.

As illustrated in FIG. 3c each frame includes eight slots. Within each slot eight address bits and sixteen data bits are transferred synchronously with a clock signal. Packets consisting of command and data information from one device may not be interrupted by another packet from another device.

C. The ASIC 112

Figure 3F:
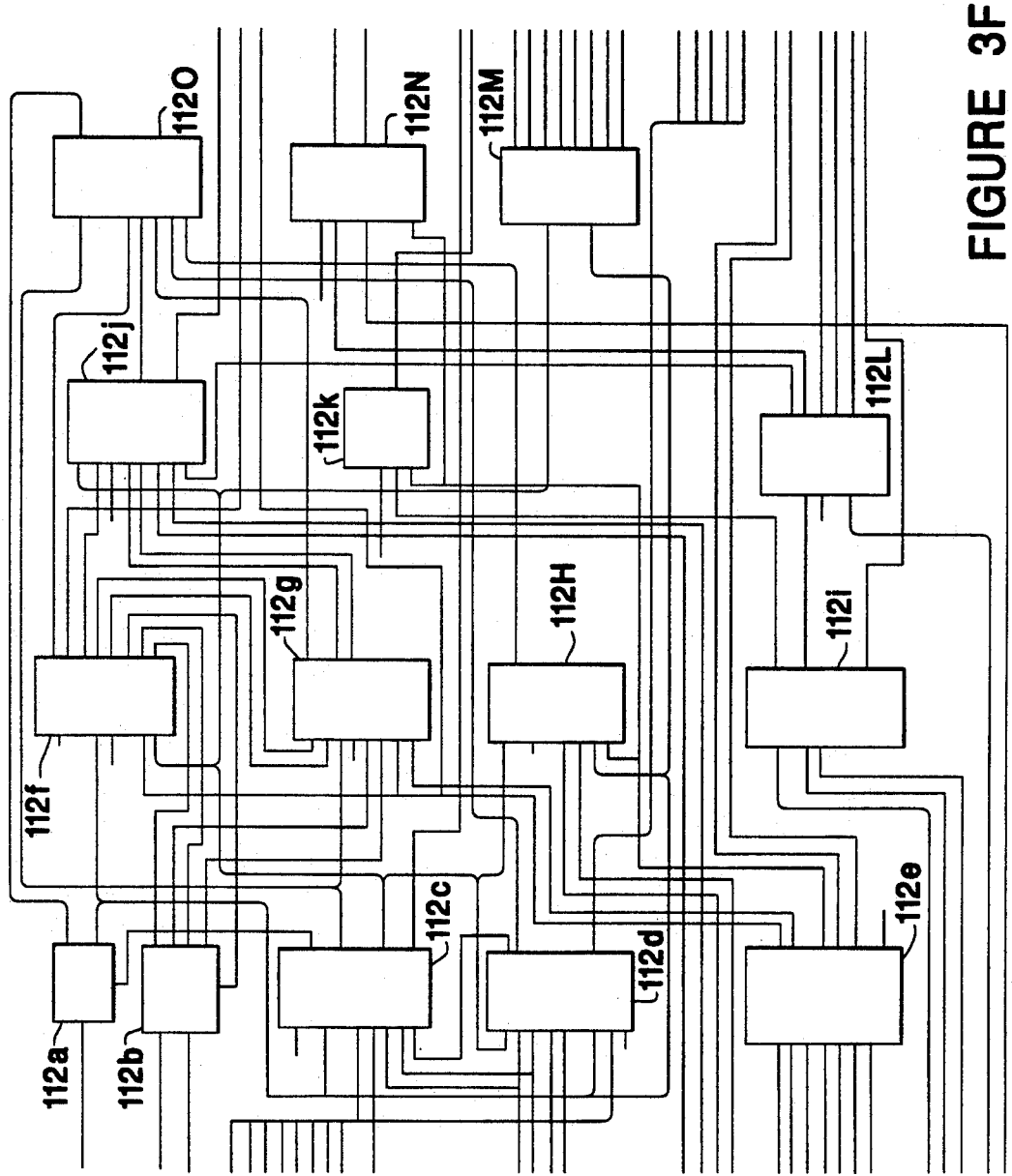
FIG. 3f illustrates on example of an ASIC in accordance with the preferred embodiment illustrated in FIG. 3.

One example of an ASIC 112 (FIG. 3) in accordance with the present invention is illustrated in FIG. 3f. As noted above, the memory and address map for the microprocessor 122 (FIG. 3) is illustrated, for example, in FIG. 3d. FIG. 3e shows an address map for the ASIC 112.

The ASIC 112 may include a pair of bidirectional buffers 112a and 112b which are used for data transfer among external devices. A MPU decoder circuit 112c may be used to deliver a chip select signal to the microprocessor 122. The chip select signal defines the address range (0340H–035FH) of the microprocessor 122. The MPU decoder circuit 112c may also be used to deliver a clock signal which drives the LCD controller 124.

As described below with reference to the microsoftener 118, operating programs may be loaded and stored in a static RAM 126. A protect circuit 112d may be used to prevent unauthorized memory loading. Prior to loading an operating program into the static RAM 126, the protect circuit 112d determines whether a valid 8-bit passcode has been loaded. If a valid 8-bit passcode has been loaded, then data may be written into the memory map address range 02000H to 0FFFFH. Absent a valid 8-bit passcode, no data will be written to the memory map address range 02000H to 0FFFFH.

In accordance with the preferred embodiment, the memory of the static RAM 126 may be 128 k bytes. The microprocessor 122, however, may only be able to access an address range of 64 bytes. As such, the protect circuit 112d may also include a bank change circuit which enables the microprocessor 122 to access the full 128 k bytes. The microprocessor 122 writes data to the address 0344H to enable the bank change function. When the microprocessor 122 addresses the range 2000H to 3FFFH, it actually addresses the range illustrated in FIG. 3d in accordance with the contents of the 0344H register.

Clock signals having respective frequencies of 14.4 MHz (XIN1) and 7.776 MHz (XIN2) may be received by a divider circuit 112e. The divider circuit 112e may in turn provide 1.8 MHz clock signals for the RF board illustrated in FIG. 6 (TDMCLK1) and for the TDM bus 116 (TDMCLK2). The divider circuit may also provide a 3.6 MHz clock signal for the internal circuitry ASIC 112 and a 7.2 MHz signal for the microprocessor 122.

The ASIC 112 may include a TDM transmitter circuit 112f which includes a number of registers that operate in the following manner. A transmit channel select (TSCR) register (0350H) identifies which of the time slots the microprocessor 122 can use. If, as illustrated for example in FIG. 3b, such slots include slot 0 and slot 4, then the content of this register would be 11H. A TDM transmit address (TTA) register (0351H) uses the addresses shown in FIG. 3b to determine which one of the voice codec 102, the voice DSP 110 and the baseband DSP 114 data is to be transmitted. A first TDM transmit data (TRT1) register (0352H) may be used to store an upper 8-bit data to be transmitted over the TDM bus 116. A second TDM transmit data (TRT2) register (0353H) may be used to store a lower 8-bit data to be transmitted over the TDM bus 116.

After the microprocessor 122 (FIG. 3) has specified the contents of the TSCR, TTA, TRT1 and TRT2 registers, the ASIC 112 transmits the data stored in the TRT1 and TRT2 registers to the device specified by the TTA register over the TDM bus 116 (FIGS. 3, 3a and 3b) in the time slot specified by the TSCR register. When the ASIC 112 has completed the transmission, it supplies an interrupt signal to the microprocessor 122 which causes the EOFTX flag of the interrupt register (035CH) to become "1." The microprocessor 122 then reads the interrupt transmit empty clear register (0354H). The interrupt signal may then be disabled and the EOFTX flag goes to "0." Finally, the microprocessor 122 can read the contents of the transmit channel number monitor register (0355H) to determine the current time slot number.

The ASIC 112 may also include a TDM receiver circuit 112g. The TDM receiver circuit 112g includes first and second TDM data registers (0358H and 0359H). When one of the voice codec 102, the voice DSP 110 and the baseband DSP 114 (FIG. 3) transmit data along with a 40H signal address signal, the ASIC 112 stores the data in the first and second TDM data registers (0358H and 0359H). The ASIC 112 then supplies an interrupt signal to the microprocessor 122 which causes the TR1 FULL flag of the interrupt register (035CH) to become "1." The microprocessor 122 then reads the data stored in the first and second TDM data registers (0358H and 0359H). Thereafter, the interrupt signal is disabled and the TR1 FULL flag becomes "0."

The TDM receiver circuit 112g also includes first and second TDM command registers (035AH and 035BH). When one of the voice codec 102, the voice DSP 110 and the baseband DSP 114 (FIG. 3) transmit data along with an 80H address signal, the ASIC 112 stores the data in the first and second TDM command registers (035AH and 035BH). The ASIC 112 then supplies an interrupt signal to the microprocessor 122 which causes the TR1 FULL flag of the interrupt register (035CH) to become "1." The microprocessor 122 then reads the data stored in the first and second TDM command registers (035AH and 035BH). In order to enable the microprocessor 122 to identify the origin of a command, the command set will be a "global" command set. Thereafter, the interrupt signal is disabled and the TR1 FULL flag becomes "0."

The ASIC 112 may also include an energy management unit (EMU) interface circuit 112h. The energy management functions are described below with reference to FIG. 11.

A DSP decoder circuit 112i may be used to address decode the baseband DSP 114. FIG. 3g illustrates the I/O map of the baseband DSP 114. Expanded I/O ports for the baseband DSP 114 are provided by a DSP I/O circuit 112L which is a latched write-only output port.

The microprocessor 122 may receive six different interrupt signals. These signals are supplied by the interrupt circuit 112j which includes the interrupt register (035CH) and an interrupt mask register (035DH). The interrupt register (035CH) stores the following interrupt signals: (1) a MAHO interrupt signal which corresponds to the baseband DSP 114 and is connected to bit 0 of port E in the DSP I/O map; (2) a RTC interrupt signal which corresponds to the real time clock 128; (3) a SOFTN interrupt signal which corresponds to the microsoftener 118; (4) a TXEMP interrupt signal; (5) the TR1 FULL interrupt signal which is discussed above; and (6) the EOFTX interrupt signal which is discussed above. The interrupt mask register (035DH) can selectively enable and disable each of these interrupt signals.

The ASIC 112 may also include a watch dog timer circuit 112k which cuts off power to the entire system if the operating program of the baseband DSP 114 (FIG. 3) loops. When the baseband DSP 114 is operating properly, the watch dog timer circuit 112k constantly accesses port D of the DSP I/O map so as to prevent the cutting off of the power supply.

The baseband DSP 114 may directly access the ASIC 112 through a DSP I/O circuit 112l. The microprocessor 122 can directly access the ASIC 122 through a MPU I/O circuit 112m.

The baseband DSP 114 may operate in a "burst" mode at a low duty cycle. A power save circuit 112n controls the supply of the clock signal to the baseband DSP 114, which may enable and disable its own clock. The resulting savings in power extends the standby time of the entire system.

A multiplexer 112o may be used to multiplex the various internal data bus paths onto a single external bus.

D. The RF Board

An RF board in accordance with the preferred embodiment is connected to the logic board by connectors 136 and 138 in FIG. 3 and is illustrated, for example, in FIG. 6. The top portion of the RF board diagram is the transmit path and the bottom portion of the diagram is the receive path. The RF board has full duplex transceiver capability, as is required for the analog mode. Although full duplex is not necessarily required for the digital mode, the North American dual mode system has an analog control channel. Thus, even if the cellular telephone is operating in the digital mode, an analog control channel is required.

With respect to the transmit path, transmit enable/disable signals power-amp-on (PAON) and transmit-on (TXON) are transferred from the baseband codec 120 to a differential quadrature phase shift-key (DQPSK) modulator 200. Transmit signals, TXI+ and TXI− (in phase) and TXQ+ and TXQ− (quadrature phase), are also transferred from the baseband codec 120 to the DQPSK modulator 200. The DQPSK modulator 200 also receives an input from a phase lock loop. The phase lock loop included a voltage control oscillator 202, a loop filter 204 and a phase lock loop chip 206 which combine to provide a reference frequency. The reference frequency may be used to convert the transmit signal up to an 800 Mhz transmit frequency. The phase lock loop chip 206 (and phase lock loop chips 252 and 274 which are discussed below) may be frequency programmed by the microprocessor 122 through a serial interface. The serial interface may consist of a common data line (DATA), a common clock line (CLK) and separate strobe lines (STRB). The data line carries individual RF channel data bits. The clock line shifts the data into serial-to-parallel shift registers contained within the phase lock loop chips. As known in the art, the shift registers are programmable down counters. The strobe lines "latch" the serial data into the shift registers.

The DQPSK modulator 200 is controlled by the baseband codec 120. The DQPSK modulator 200 has essentially three inputs, in phase, quadrature phase, and a loop oscillator input provided by the phase lock loop. The DQPSK 200 includes mixers which mix the input up to 800 MHz and sum the in phase and quadrature phase channels. The output from the DQPSK 200 is transferred to a bandpass filter 210 which removes second and third order harmonics. Thereafter, the signal is diverted to either a digital power amplifier 222 or an analog power amplifier 216 by a single pole double throw (SPDT) RF switch 212, depending on the current operating mode. The path to the analog power amplifier 216 may include preamplifier 214. The analog power amplifier 216 operates in class C mode. The path to the digital power amplifier 222 includes a variable attenuator 218 and a preamplifier 220. The digital power amplifier 222 may be a linearized power amplifier and may operate in the class AB mode.

The signal is then passed through a SPDT RF switch 224 to an isolator 226 which acts as a protection device to keep power from being reflected back to the power amplifiers in the event that the antenna it not connected, is shorted, etc. Next, the signal passes through a coupler 228 which provides a feedback path via a detector 23D. The detector 230 detects the amount of power that is being transmitted and sends a signal to the baseband codec 120 which is A/D converted and transferred to the baseband DSP 114. The converted signal is used in a loop to insure that the system is transmitting at the proper power level. From the coupler 228, the signal is sent to a duplexer 232 which acts as a filter and separates the transmit band from the receive band. The duplexer 232 is connected to either an internal antenna 236 or an external antenna 238 (a vehicle antenna) by a switch 234. The switch 234 is controlled by an EXTRF signal (see FIG. 3).

With respect to the receive path, when an 800 MHz signal is received by one of the antennae, the signal passes through the antenna switch 234, through the duplexer 232, and then into a first matching network 240. The first matching network 240, like others described below, acts as a filter which matches the output impedance of duplexer 232 with the device that follows. The signal then proceeds to a low noise amplifier 242, preferably a TQ9201 made by Triquint Semiconductor. From the low noise amplifier 242, the signal passes through a number of filters, i.e. second matching network 244, an RX bandpass filter 246, and a third matching network 248.

The 800 MHz signal then enters a mixer 250 where it is converted to a lower frequency signal. The mixer 250 may have two inputs and one output. The first input is the received 800 MHz signal. The second input comes from another phase lock loop which includes a phase lock loop chip 252, a loop filter 254 and a voltage control oscillator 256. The phase lock loop chip 252 may be put into a "low-power" operating mode by a RXSAVE1 signal. A band pass filter 258 and a fourth matching network 260 may be respectively provided to remove harmonics and to match impedances. The second input is essentially a tunable synthesizer which, when mixed with the 800 MHz input, produces a signal having an intermediate frequency (IF) of 94.3 MHz. That is the frequency shift, or heterodyning, function of the receiver. The output of the first mixer 250 then passes through a fifth matching network 264, a surface acoustic wave (SAW) filter 266 and a sixth matching network 268. The matching is required because the SAW filter 266 is a high impedance device. The SAW filter 266 provides a very sharp rejection of out of band signals and noise.

The signal next enters a receiver chip 270, preferably a W2005 made by AT&T. The receiver chip 270 includes a mixer 272 so that the IF of the signal may be changed to 450 kHz. There are two inputs to the mixer 272 and one output. One input receives the 94.3 MHz signal from matching network 268. The other input is connected to a phase lock loop which includes a phase lock loop chip 274, a voltage control oscillator 276 and a loop filter 278. The phase lock loop chip 274 may be put into a "low-power" operating mode by a RXSAVE2 signal. The signal output from the mixer 272 is at 450 kHz. The signal then passes through digital filters 280 and 282 which remove out of band signals. The signal is then fed either to an analog path or a digital path.

The analog path includes an IF amplifier 284, a filter 286, a limiter amplifier 288 and an FM demodulator 290. The digital path includes an IF amplifier 292 and a DQPSK demodulator 294. The DQPSK demodulator 294 provides in phase (RXI+ and RXI−) and quadraphase (RXQ+ and RXQ−) signals to the baseband codec 120.

Also included on the RF board is a voltage control transmit crystal oscillator (VCTCXO) 296. The VCTCXO 296 is the reference that is used to generate all of the RF frequencies. Automatic frequency control (AFC) is controlled by the baseband DSP 114 through the D/A converter in the baseband codec 120. The VCTXO 296 also supplies, through a buffer 298, the basic clock frequency used on the main board to run the microprocessor system. Such an arrangement minimizes the number of crystals in the system, which in turn increases reliability and minimizes noise.

ANALOG CONVERSATION

Reverting to FIG. 3, in accordance with the preferred embodiment, when the cellular telephone 10 is operating in the analog conversation mode, the voice codec 102 converts analog signals from the microphone to digital data at a sampling rate of 8 kHz. The baseband DSP 114 receives data from the voice codec 102 through the TDM bus 116 and processes that data. The baseband DSP 114 then sends an FM modulated signal to a baseband codec 120. The D/A converter in the baseband codec 120 converts signals from digital to analog and then sends the signals to the RF board. The RF board then converts the signals to the transmitting frequency, 800 MHz for example, to be sent out over the channel in the manner described below. Similarly, a received signal is FM demodulated by the RF board, it is sent to the baseband codec 120. The baseband codec 120 A/D converts the signal and sends it to the baseband DSP 114. The baseband DSP 114 performs the reverse audio functions, companding, filtering and supervisory tone detection. The signal is then sent to the voice codec 102 where it is D/A converted and transferred to either the speaker connector 104 or the external connector 106.

Figure 7:
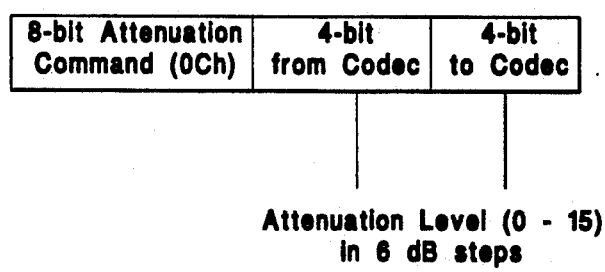
FIG. 7 illustrates an attenuation command signal in accordance with the preferred embodiment of the present invention.

When the cellular telephone 10 is operating in the analog mode, the only command that the voice DSP 110 will send to the baseband DSP 114 is an 8-bit attenuation command (illustrated for example in FIG. 7), and such command will only be sent while echo suppression (described below) is active. No commands or data are sent from the baseband DSP 114 to the voice DSP 110 when the cellular telephone 10 is operating in the analog mode.

DIGITAL CONVERSATION

Figure 8:
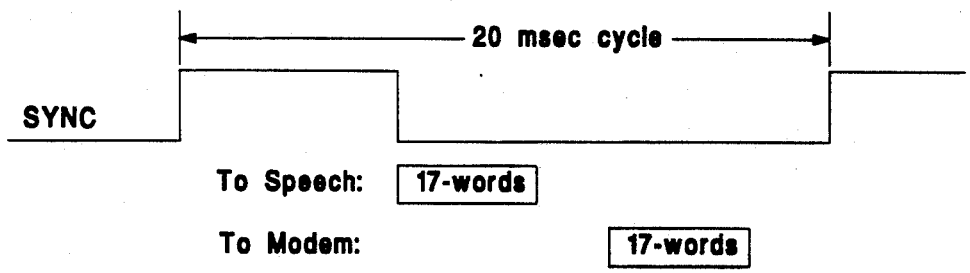
FIG. 8 illustrates the transfer of audio signals between a voice digital signal processor and baseband digital signal processor in accordance with the preferred embodiment of the present invention.

The digital mode of operation is similar to the analog mode except that there is no FM analog signal. Rather, the signal received and transmitted to the base station is a digital signal. When operating in the digital mode, audio signals from the microphone are digitized by the voice codec 102. The voice DSP 110 VSELP encodes and compresses the digitized audio signal. As illustrated for example in FIG. 8, the voice DSP 110 will transfer portions of the audio signal to the baseband DSP 114 in 17-word data blocks during a 20 ms full-rate frame (or 40 ms half-rate frame). Such block transfers occur over the TDM bus 116 and are hardware synchronized by a hardware SYNC signal from the baseband DSP 114. Similarly, the baseband DSP 114 will transfer a 17-word data block to the voice DSP 110 during each 20 ms full-rate frame (or 40 ms half-rate frame).

Shortly after the hardware SYNC signal goes from high to low, the baseband DSP 114 begins the block transfer. The 17-word data block transferred from the baseband DSP 114 to the voice DSP 110 includes packed raw channel data and control information,(one word every 82 micro sec.). The channel data contains Class1 and Class2 bits as defined in IS-54 and which may be packed in the manner illustrated in TABLE 1.

TABLE 1

| BIT | | | | | | | | | | | | | | | | |
|---|---|---|---|---|---|---|---|---|---|---|---|---|---|---|---|---|
| 15 | 14 | 13 | 12 | 11 | 10 | 9 | 8 | 7 | 6 | 5 | 4 | 3 | 2 | 1 | 0 | |
| $C1_0$ | $C1_1$ | $C1_2$ | $C1_3$ | $C1_4$ | $C1_5$ | $C1_6$ | $C1_7$ | $C1_8$ | $C1_9$ | $C1_{10}$ | $C1_{11}$ | $C1_{12}$ | $C1_{13}$ | $C1_{14}$ | $C1_{15}$ | WRD 0 |
| $C1_{16}$ | $C1_{17}$ | $C1_{18}$ | $C1_{19}$ | $C1_{20}$ | $C1_{21}$ | $C1_{22}$ | $C1_{23}$ | $C1_{24}$ | $C1_{25}$ | $C1_{26}$ | $C1_{27}$ | $C1_{28}$ | $C1_{29}$ | $C1_{30}$ | $C1_{31}$ | WRD 1 |
| $C1_{32}$ | $C1_{33}$ | $C1_{34}$ | $C1_{35}$ | $C1_{36}$ | $C1_{37}$ | $C1_{38}$ | $C1_{39}$ | $C1_{40}$ | $C1_{41}$ | $C1_{42}$ | $C1_{43}$ | $C1_{44}$ | $C1_{45}$ | $C1_{46}$ | $C1_{47}$ | WRD 2 |
| $C1_{48}$ | $C1_{49}$ | $C1_{50}$ | $C1_{51}$ | $C1_{52}$ | $C1_{53}$ | $C1_{54}$ | $C1_{55}$ | $C1_{56}$ | $C1_{57}$ | $C1_{58}$ | $C1_{59}$ | $C1_{60}$ | $C1_{61}$ | $C1_{62}$ | $C1_{63}$ | WRD 3 |
| $C1_{64}$ | $C1_{65}$ | $C1_{66}$ | $C1_{67}$ | $C1_{68}$ | $C1_{69}$ | $C1_{70}$ | $C1_{71}$ | $C1_{72}$ | $C1_{73}$ | $C1_{74}$ | $C1_{75}$ | $C1_{76}$ | $C1_{77}$ | $C1_{78}$ | $C1_{79}$ | WRD 4 |
| $C1_{80}$ | $C1_{81}$ | $C1_{82}$ | $C1_{83}$ | $C1_{84}$ | $C1_{85}$ | $C1_{86}$ | $C1_{87}$ | $C1_{88}$ | $C1_{89}$ | $C1_{90}$ | $C1_{91}$ | $C1_{92}$ | $C1_{93}$ | $C1_{94}$ | $C1_{95}$ | WRD 5 |
| $C1_{96}$ | $C1_{97}$ | $C1_{98}$ | $C1_{99}$ | $C1_{100}$ | $C1_{101}$ | $C1_{102}$ | $C1_{103}$ | $C1_{104}$ | $C1_{105}$ | $C1_{106}$ | $C1_{107}$ | $C1_{108}$ | $C1_{109}$ | $C1_{110}$ | $C1_{111}$ | WRD 6 |
| $C1_{112}$ | $C1_{113}$ | $C1_{114}$ | $C1_{115}$ | $C1_{116}$ | $C1_{117}$ | $C1_{118}$ | $C1_{119}$ | $C1_{120}$ | $C1_{121}$ | $C1_{122}$ | $C1_{123}$ | $C1_{124}$ | $C1_{125}$ | $C1_{126}$ | $C1_{127}$ | WRD 7 |
| $C1_{128}$ | $C1_{129}$ | $C1_{130}$ | $C1_{131}$ | $C1_{132}$ | $C1_{133}$ | $C1_{134}$ | $C1_{135}$ | $C1_{136}$ | $C1_{137}$ | $C1_{138}$ | $C1_{139}$ | $C1_{140}$ | $C1_{141}$ | $C1_{142}$ | $C1_{143}$ | WRD 8 |
| $C1_{144}$ | $C1_{145}$ | $C1_{146}$ | $C1_{147}$ | $C1_{148}$ | $C1_{149}$ | $C1_{150}$ | $C1_{151}$ | $C1_{152}$ | $C1_{153}$ | $C1_{154}$ | $C1_{155}$ | $C1_{156}$ | $C1_{157}$ | $C1_{158}$ | $C1_{159}$ | WRD 9 |
| $C1_{160}$ | $C1_{161}$ | $C1_{162}$ | $C1_{163}$ | $C1_{164}$ | $C1_{165}$ | $C1_{166}$ | $C1_{167}$ | $C1_{168}$ | $C1_{169}$ | $C1_{170}$ | $C1_{171}$ | $C1_{172}$ | $C1_{173}$ | $C1_{174}$ | $C1_{175}$ | WRD 10 |
| $C1_{176}$ | $C1_{177}$ | $C2_0$ | $C2_1$ | $C2_2$ | $C2_3$ | $C2_4$ | $C2_5$ | $C2_6$ | $C2_7$ | $C2_8$ | $C2_9$ | $C2_{10}$ | $C2_{11}$ | $C2_{12}$ | $C2_{13}$ | WRD 11 |
| $C2_{14}$ | $C2_{15}$ | $C2_{16}$ | $C2_{17}$ | $C2_{18}$ | $C2_{19}$ | $C2_{20}$ | $C2_{21}$ | $C2_{22}$ | $C2_{23}$ | $C2_{24}$ | $C2_{25}$ | $C2_{26}$ | $C2_{27}$ | $C2_{28}$ | $C2_{29}$ | WRD 12 |
| $C2_{30}$ | $C2_{31}$ | $C2_{32}$ | $C2_{33}$ | $C2_{34}$ | $C2_{35}$ | $C2_{36}$ | $C2_{37}$ | $C2_{38}$ | $C2_{39}$ | $C2_{40}$ | $C2_{41}$ | $C2_{42}$ | $C2_{43}$ | $C2_{44}$ | $C2_{45}$ | WRD 13 |
| $C2_{46}$ | $C2_{47}$ | $C2_{48}$ | $C2_{49}$ | $C2_{50}$ | $C2_{51}$ | $C2_{52}$ | $C2_{53}$ | $C2_{54}$ | $C2_{55}$ | $C2_{56}$ | $C2_{57}$ | $C2_{58}$ | $C2_{59}$ | $C2_{60}$ | $C2_{61}$ | WRD 14 |
| $C2_{62}$ | $C2_{63}$ | $C2_{64}$ | $C2_{65}$ | $C2_{66}$ | $C2_{67}$ | $C2_{68}$ | $C2_{69}$ | $C2_{70}$ | $C2_{71}$ | $C2_{72}$ | $C2_{73}$ | $C2_{74}$ | $C2_{75}$ | $C2_{76}$ | $C2_{77}$ | WRD 15 |
| $C2_{78}$ | $C2_{79}$ | $C2_{80}$ | $C2_{81}$ | X11 | X10 | X9 | X8 | X7 | X6 | X5 | X4 | X3 | X2 | X1 | X0 | WRD 16 |

$C_1$ = Class 1 bits (178)
$C_2$ = Class 1 bits (82)

Figure 9:
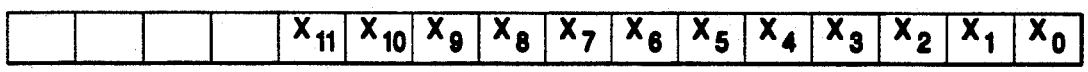
FIG. 9 illustrates a data block in accordance with the preferred embodiment of the present invention.

The control information may be included in 12 bits which are defined within the last word of the 17-word block. The 12 control bits in the last word transferred from the baseband DSP 114 to the voice DSP 110 are illustrated in FIG. 9, and may be defined, for example, as follows:

$X_{11}$ Loopback mode (1=enable). When enabled, the voice DSP 110 will echo the received data bits after convolutional encoding and decoding without cyclic redundancy check regeneration. This function is used in conjunction with the mode of the IS-54/IS-55 test interface that checks the integrity of error-correcting and error-decoding code applied to speech data.

$X_{10}$ Mute (1=enable). When enabled, the voice DSP 110 will use prestored VSELP codes representing muted auido (i.e. comfort noise) and return the encoded data to the baseband DSP 114 on the next frame.

$X_9$ DTMF (1=enable). When enabled, the voice DSP 110 will generate a DTMF tone (20 ms) as defined by the table lookup addressed by data bits $X_0$–$X_5$. The tone will be used for receive audio only.

$X_8$ Sidetone (1=enable). When enabled, the voice DSP 110 will echo a portion of the microphone audio signal to the speaker audio signal.

$X_{7-6}$ Gain adjust. When enabled, the voice DSP 110 will increase the audio output level by the specified amount by adjusting the codec data as follows: 0 dB gain when $X_7=0$ and $X_6=$; 3 dB gain when $X_7=0$ and $X_6=1$; 6 dB gain when $X_7=1$ and $X_6=0$; and 9 dB gain when $X_7=1$ and $X_6=1$.

$X_{5-0}$ Data field. Defines prestored DTMF tones.

After receiving the 17th word from the baseband DSP 114, the voice DSP 110 returns a 17-word block (one word every 125 micro sec.) containing VSELP encoded data and control information. The 12 control bits in the last word transferred from the voice DSP 110 to the baseband DSP 114 may be defined, for example, as follows:

$X_{11}$ Reserved.

$X_{10}$ Speech activity (1=active). This bit indicates the presence or absence of speech activity based on frame energy.

$X_9$ Reserved.

$X_8$ Cyclic redundancy check (CRC). Result (1=bad result). This bit indicates the result of a CRC calculation of the previous frame of decoded data.

$X_{7-0}$ Bit errors. This field contains the total number of bit errors detected in the last data frame. Bit errors are computed based on the metric of the convolutional decoding of the last 178 Class1 bits. The maximum value of this field may be 89, i.e. a 50% error rate.

The voice DSP 110 monitors the hardware SYNC signal and may perform some or all of the following functions each 20 msec interval as synchronized by the hardware SYNC signal: convolutional decoding (such as Viterbi decoding) of Class1 bits; CRC decoding/error detection; formatting of Class1/Class2 decode bits; bit error rate (BER) calculation of Class1 bits; bad frame masking algorithm (IS-54); VSELP decoding and encoding; CRC encoding; formatting of Class1 and Class2 encode bits; convolutional encoding; loopback mode control; speech activity detection; DTMF generation/overlay; and voice storage and speakerphone functions.

The North America TDMA system currently has three time slots every 20 ms. Thus, three users may be on the same RF channel and the base station will assign a particular time slot within an RF channel during the call processing setup. Upon reception of the 17-word data block from the voice DSP 110, the baseband DSP 114 adds coding for protection over the RF channel. The baseband DSP 114 then sends the data in a 6.7 ms burst in a particular time slot through the baseband codec 120. The baseband codec 120 D/A converts the data, performs waveform shaping and creates a pi/4 QPSK signal. The QPSK signal is then sent to the modulator 200 on the RF board, converted to 800 MHz and, finally, transmitted on the RF channel.

Data is received in a similar manner. The signal is received by the receiver chip 270. The FM signal is FM demodulated by the FM demodulator 290 and the TDMA signal is linearly demodulated by the DSPQK demodulator 294. The TDMA signal is then made available to the baseband codec 120 by the in phase channel RXI and the quadrature channel RXQ. The baseband codec 120 A/D converts the signal and sends samples at a 48.6 kHz rate to the baseband DSP 114. The baseband DSP 114 provides clock recovery to recover the digital signal by employing an equalizer detector to detect the signal and decide when to convert the signal to 1 s and 0 s. The baseband DSP 114 then takes the signal and separates the forward error correction information from the speech data and passes the data on to the voice DSP 110 in the 17-word data block. As known in the art, forward error correction corrects any errors that were in the transmission. The voice DSP 110 also does CRC on each word to determine whether the word was so corrupted that the audio should be muted for that particular speech segment. The voice DSP 110 then performs VSELP decoding on the data. The VSELP decoding converts the data to an 8 kHz signal which is then transferred to the voice codec 102. The voice codec 102 D/A converts the signal and sends an analog signal to the speaker connector 104 or the external connector 106.

ECHO SUPPRESSION

Figure 10:
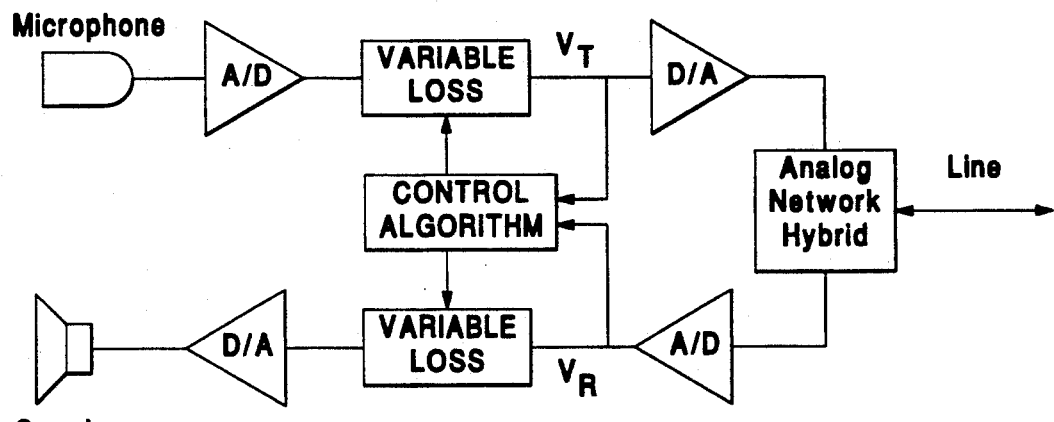
FIG. 10 illustrates a circuit for execution of a control algorithm in accordance with the preferred embodiment of the present invention.

FIG. 10 illustrates the manner in which the voice DSP 110 executes the echo suppression control algorithm. The control algorithm is essentially the same in the analog mode as it is in the digital mode. Echo is suppressed by introducing loss into one of the transmit path and the receive path when the energy in the other path is greater than a the energy in the one path and is higher than a selected threshold. The loss may be from 0 to 40 dB. In other words, one of the paths may be "switched off" while the other is "switched on."

Audio signals from the microphone are A/D converted by the voice codec 102 and processed by the voice DSP 110 at a rate of 8 kHz. The signals are continuously sampled and stored as 20 msec. speech segments for the transmit path. Similarly, received signals are transferred from the baseband DSP 114 to the voice DSP 110 at a 8 kHz rate. The signals are continuously sampled and stored as 20 msec. speech segments for the receive path. The energy (or power) for each 20 msec. segment is calculated by squaring each of the 160 signal magnitude samples occurring during 20 msec. and accumulating the sum for each 20 msec. segment for each path. Individual segments are then averaged over a longer time interval, to determine the average energy of each path. The "switch" time is determined by comparing the average segment energy to a predetermined "switch" threshold, for example 15/100 in an automobile environment and 10/100 in an office environment. The "hold" or override time is determined by comparing the average segment energy to a predetermined "hold" threshold, such as 60/100 in an automobile and 40/100 in an office.

During digital conversation, the voice DSP 110 operates in the digital conversation mode 00 (see FIG. 4), its primary mode of operation. The microprocessor 122 must enable the voice codec 102 before entering this mode. Echo suppression is performed directly on the codec data.

During analog conversation, the voice DSP 110 normally remains in the idle mode 01 and the baseband DSP 114 will access the codec functions directly. However, the voice DSP 110 performs the echo suppression function used during speakerphone operation, i.e. when the handheld portable cellular telephone 10 is inserted into the interface adapter. Thus, the voice DSP 110 includes an analog conversation mode 10. During speakerphone operation, the voice DSP 110 will monitor the baseband DSP 114, transmit and receive data to and from the voice codec 102 and send attenuation commands to the baseband DSP 114 at periodic intervals. In effect, the voice DSP 110 "passively listens" to the data passed between the baseband DSP 114 and the voice codec 102 and merely affects the path gains. The microprocessor 122 must enable the voice codec 102 before the analog conversation mode 10 command is sent to the voice DSP 110.

VOICE STORAGE FUNCTIONS

In accordance with the preferred embodiment, a number of voice storage functions are provided which enable the cellular phone 10 to function in a manner similar to a telephone answering device. These functions may be initialized by depressing one of the miscellaneous keys 14a-14c on the cellular phone 10 or in response to an incoming call as is known in the art.

Two such functions are the audio record and audio playback functions. The audio record function allows a user to leave a preset message for a caller such as, "I'm away from my phone, please leave a message." The audio playback function enables review of recorded messages, both preset message and those which may be left by callers in the manner described below. These functions are only operable when the handheld cellular telephone is idle, i.e. when no conversation is active.

With respect to the audio record function, the microprocessor 122 will enable the voice codec 102 and then send an audio record mode command to the voice DSP 110. In response to the audio record mode command, the voice DSP 110 will enter an audio record mode 02 (see FIG. 4). In the audio record mode 02, the voice DSP 110 reads samples from the A/D converter of the voice codec 102. The samples are VSELP encoded and sent as 11-word blocks to the microprocessor 122 at a 20 msec. rate. The microprocessor 122 will store the 11-word blocks in the static RAM 126. If echo suppression is in effect, no audio sidetone will be generated, i.e. the voice DSP 110 will not deliver a portion of the recorded audio to the D/A converter of the voice codec 102 and the external connector 106.

With respect to the audio playback function, the microprocessor 122 will enable the voice codec 102 and then send an audio playback mode command to the voice DSP 110. In response to the audio playback command, the voice DSP 110 will enter the audio playback mode 03 (FIG. 4). In the audio playback mode 03, the voice DSP 110 may receive 11-word blocks from the microprocessor 122 (which retrieves the blocks from the static RAM 126), VSELP decode such 11-word blocks, and deliver output samples to the D/A converter of the voice codec 122. The analog signal is transferred to the speaker. No data will be sent to the microprocessor 122 from the voice DSP 110 during audio playback.

Two additional voice storage functions provided in accordance with the preferred embodiment are the digital conversation playback function and the digital conversation record function. The digital conversation playback function allows a recorded message to be transmitted to a caller during digital conversation. Similarly, the digital conversation record function allows the caller to leave a message during digital conversation. These functions may be initialized by the microprocessor 122 when the cellular telephone 10 receives a call, but is not answered by the user. The digital conversation record function may also be initialized by the user during active conversation.

With respect to the digital conversation playback function, the microprocessor 122 will enable the voice codec 102 and then send the digital conversation playback mode command to the voice DSP 110. In response to the digital conversation playback mode command, the voice DSP 110 will enter the digital conversation playback mode 05 (FIG. 4). The microprocessor 122 will then send 11-word VSELP encoded blocks from the static RAM 126 to the voice DSP 110 at a 20 ms rate. The data will then be sent on the channel. As no recording is taking place, no data is sent to the microprocessor 122. Moreover, because only on path is active, i.e. voice to channel, echo suppression is unnecessary.

With respect to the digital conversation record function, the microprocessor 122 will enable the voice codec 102 and then send a digital conversation record command to the voice DSP 110. In response to the digital conversation record mode command, the voice DSP 110 will enter the digital conversation record mode 04 (FIG. 4). In this mode, the voice DSP 110 will send 11-word VSELP encoded blocks to the microprocessor 122 at a 20 ms rate. The microprocessor 122 will store the 11-word blocks in the static RAM 126. When the digital conversation record function is being performed in response to an unanswered call, no data is being sent to the channel and echo suppression is unnecessary. However, when the digital conversation record function is being performed during active conversation, echo suppression may be performed on the codec data.

Two further voice storage functions provided in accordance with the preferred embodiment are the analog conversation playback function and the analog conversation record function. The analog conversation playback function allows a recorded message to be transmitted during analog conversation. Similarly, the analog conversation record function allows a caller to leave a message during analog conversation. These functions may be initialized by the microprocessor 122 when the cellular telephone 10 receives a call, but is not answered by the user. The analog conversation record function may also be initialized by the user during active conversation.

With respect to the analog conversation playback function, the microprocessor 122 first disables the voice codec 102 and then sends an analog conversation playback command to the voice DSP 110. In response to the analog conversation playback command mode, the voice DSP 110 will enter the analog conversation playback mode 07 (FIG. 4). In this mode, data from the static RAM 126 is sent to the voice DSP 110 in 11-word VSELP encoded blocks by the microprocessor 122 at a 20 ms. rate. The data is then VSELP decoded and sent to the baseband DSP 114 as a digital stream. As no recording is taking place, no data is sent to the microprocessor 122. Moreover, because only on path is active, i.e. voice to channel, echo suppression is unnecessary.

With respect to the analog conversation record function, the microprocessor 122 first enables the voice codec 102 and then sends an analog conversation record command to the voice DSP 110. In response to the analog conversation record command mode, the voice DSP 110 will enter the analog conversation record mode 06 (FIG. 4). In this mode, the voice DSP 110 monitors data being sent from the baseband DSP 114 to the D/A converter of the voice codec 102, VSELP encodes that data, and sends 11-word VSELP encoded blocks to the microprocessor 122 at a 20 ms rate. The encoded blocks are then stored in the static RAM 126. When the analog conversation record function is being performed in response to an unanswered call, no data is being sent to the channel and echo suppression is unnecessary. However, if the analog conversation record function is being performed during active conversation and echo suppression is in effect, then the voice DSP 110 will also monitor the data sent from the baseband codec 120 to the baseband DSP 114 and send the appropriate attenuation commands to the baseband DSP.

BATTERY PACK AND BATTERY TIME MONITORING

Figure 11:
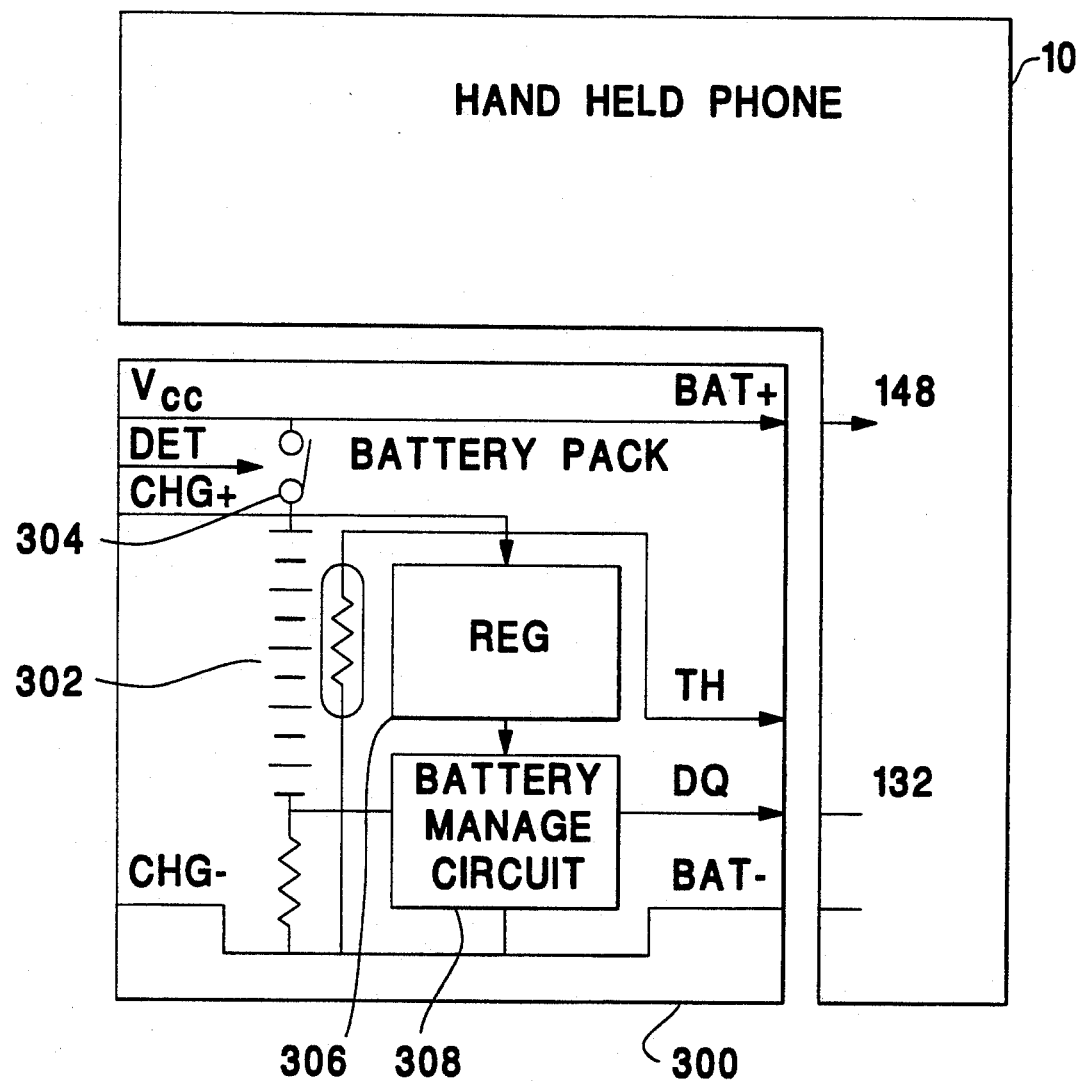
FIG. 11 illustrates a hand held cellular telephone and a battery pack in accordance with the preferred embodiment of the present invention.

As illustrated for example in FIG. 11, a battery pack 300 may be mounted in the hand held cellular telephone 10. Electrical connections therebetween are facilitated by pins in the manner known generally in the art. The battery pack 300 may include a battery 302, preferably a NiMH battery, and an FET switch 304. The battery 302 supplies power to the cellular telephone 10 through the BAT+ line when the FET switch 304 is turned on. The battery 302 is also connected to the BAT− line. The battery pack 300 may additionally include a voltage regulator 306 and a battery management circuit 308, preferably a bq2010 Energy Management Unit manufactured by Benchmarq Electronics, which monitors the state of the battery 302. Monitoring functions of the battery management circuit 308 may include recharge monitoring and capacity monitoring.

The battery management circuit 308 may be connected to the connector 132 of the logic board of FIG. 3 by line DQ. As discussed above, the connector 132 is connected to the ASIC 112, which is itself connected to the microprocessor 122. Thus, the microprocessor 122 can interrogate the battery management circuit 308 at any time to determine the amount of remaining charge in the battery 302. The information received from the battery management circuit 308 can be stored in registers within the microprocessor 122. The amount of remaining charge in the battery 302 may then be converted into remaining standby time (i.e. the time available to receive phone calls) and remaining conversation time, both digital and analog, using stored estimates of power consumption. The display 12 (FIG. 1) may be used to display the current charge status of the battery 302, the amount of remaining standby time and the amount of time available to utilize the cellular telephone 10 in one of the conversation modes. One of the miscellaneous keys 14a-14c may be used to initiate a display of the battery level.

In accordance with the preferred embodiment, the amount of remaining time may be estimated according to the amount of power consumption (or current drain with a fixed voltage). The power consumption for various operating modes may be measured and stored in the static RAM 126 so that the microprocessor 122 can make these calculations.

Alternatively, the actual current drain on the battery 302 in the hand held cellular telephone 10 can be measured. The value of the actual current drain, which would be an analog figure, can be converted by an A/D converter and then stored in the static RAM 126. Thus, a history of the current drain for each operating mode of the cellular telephone 10 can be developed so that the microprocessor 122 can utilize this "history" to provide a dynamic estimate of the amount of remaining battery time for the standby mode and the analog and digital conversation modes.

Figure 12:
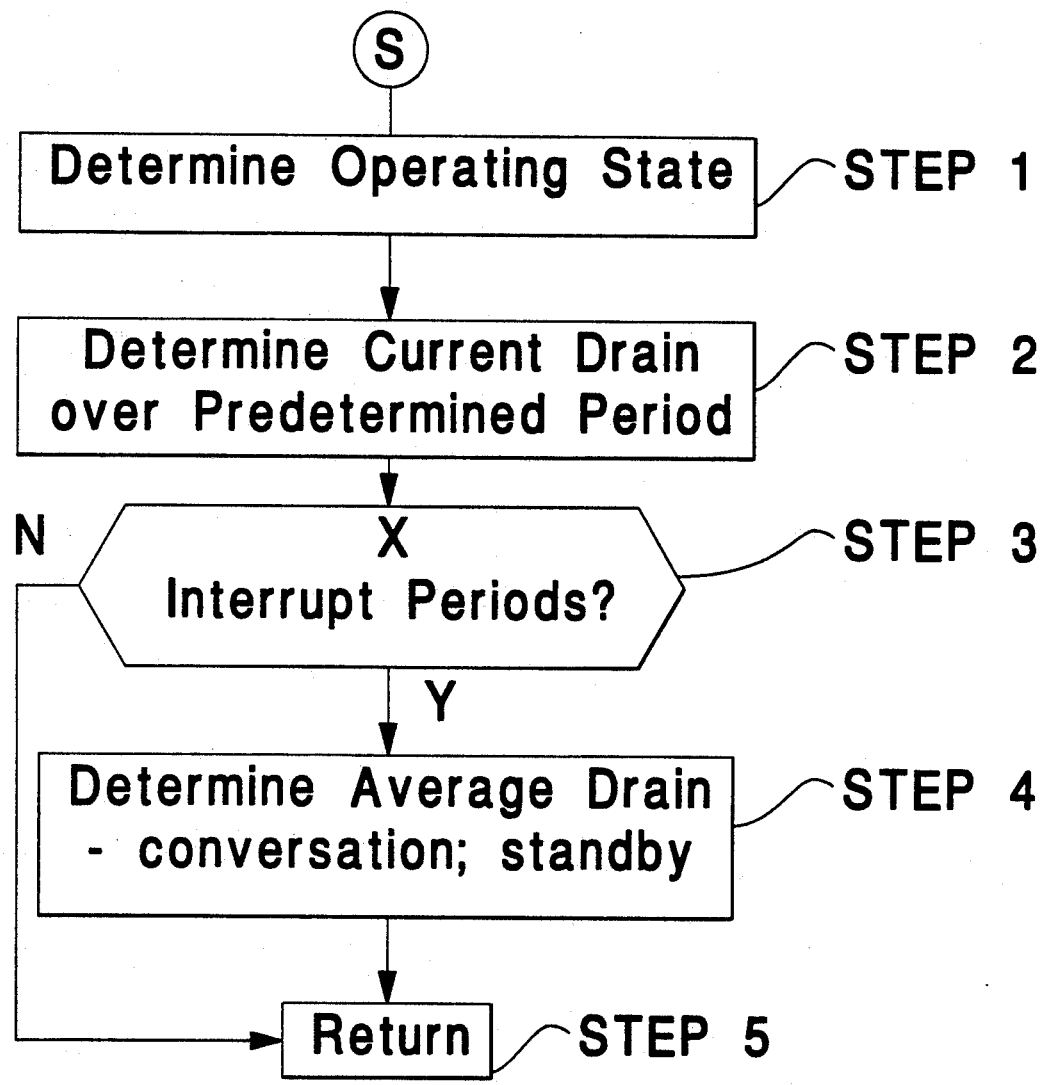
FIGS. 12 and 13 illustrate flow diagrams of routines for monitoring the status of the battery and displaying information to the user.
Figure 13:
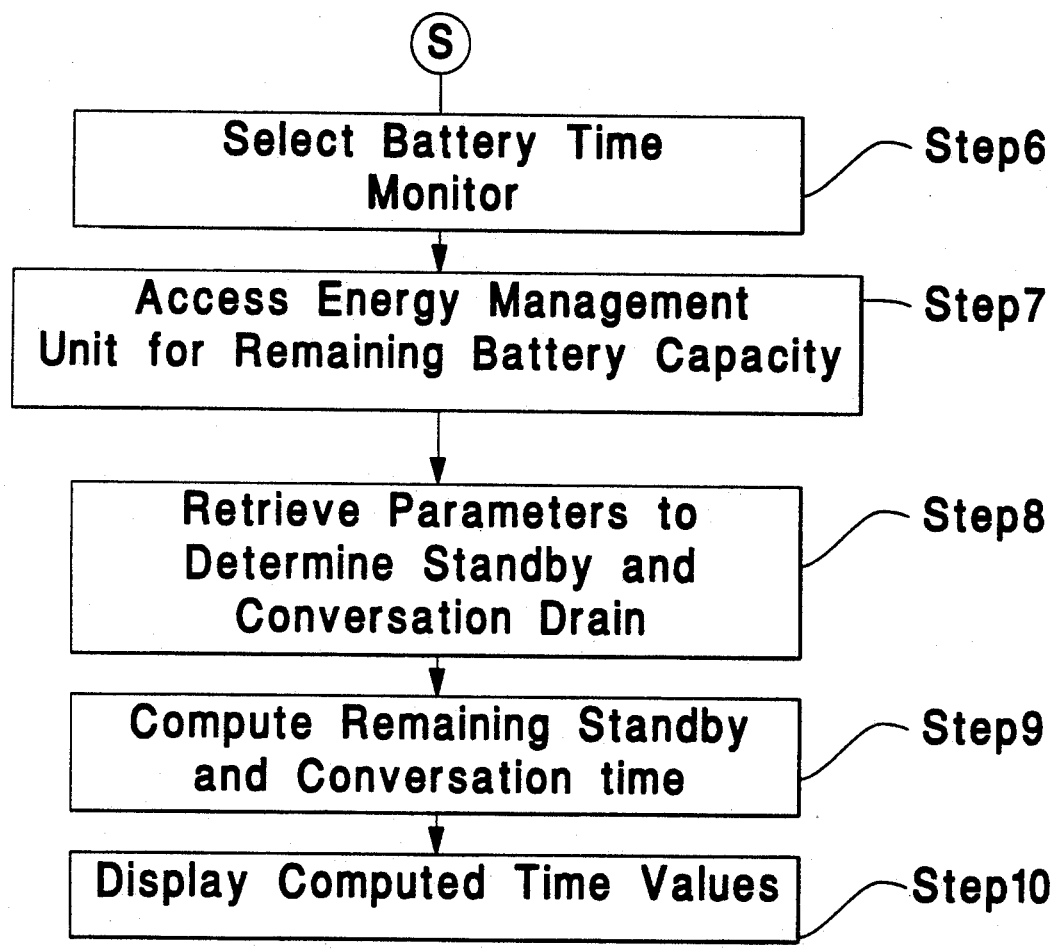

FIGS. 12 and 13 illustrate examples of routines which may be utilized by the microprocessor 122 for monitoring the status of the battery 302 and displaying the status information. The illustrated routines adapt to the user usage profile and provide an estimate of the amount of time remaining for operation of the cellular telephone in both the standby and conversation modes.

FIG. 12 illustrates an interrupt routine which may be utilized by the microprocessor 122 to update the average usage parameters of the cellular telephone 10 and to provide an estimate of the amount of current drain that will be required during standby and conversation modes. The microprocessor 122 may be programmed to perform the interrupt routine on a regular basis, for example, every 100 msec. In step 1 the microprocessor 122 determines the operating state of the cellular telephone 10.

After the operating mode of the cellular telephone is determined, the microprocessor 122 determines the current drain over a predetermined period of time in step 2. Based on the present operating mode of the cellular telephone 10 (e.g., analog conversation, digital conversation or standby) the microprocessor 122 uses a table of current drain figures to determine the current drain. The table of current drain figures may be stored, for example, in the static RAM 126. These figures are predetermined based on actual measured data for each possible operating mode over an interval which equals the interrupt interval of the microprocessor 122. For example, if the interrupt time is 100 milliseconds, the figures in the table will be measured for each possible operating mode of the cellular telephone 10 over a 100 msec. interval.

The current drain information determined by the microprocessor 122 may be stored in the static RAM 126 not shown. The microprocessor 122 accumulates the current drain information for each of the operating modes of the cellular telephone. This information, as illustrated in FIG. 12 in step 3, is accumulated over a period of time equal to X interrupt periods. X will be determined based upon the interrupt interval and the resolution of the usage display. Thus, if the battery usage information is in minutes and the interrupt interval is 100 msec., then the microprocessor 122 will accumulate battery usage information over a total of 600 interrupt periods in order to provide the resolution of one minute of displayable battery usage information. The interrupt interval may be extended or shortened.

In step 4, the microprocessor 122 determines the average drain in both of the conversation modes and the standby mode. A running average is computed for each of the modes by taking the total accumulated current drain and dividing by, for example, the 60 second time base. The result is an average power consumption (or current drain) per one minute interval (milliamp/minute). The result may be stored in the static RAM 126 for use by the display routine which will be discussed below with reference to FIG. 13.

The routine will return to step 3 in step 5 until X interrupt periods have been reached.

Predetermined worst-case estimates of power consumption may be stored in the static RAM 126. Accordingly, when a user of the cellular telephone 10 initially starts up the cellular telephone and requests a display of the battery information, the user will be provided with a worse case scenario as to the remaining battery capacity. Later, upon the acquiring of usage history through the above-discussed routine, the figures displayed to the user will be updated accordingly.

FIG. 13 illustrates the routine which is used by the microprocessor 122 to take data provided by the update routine (FIG. 12) and convert the information to a user friendly format for display. The routine can be entered whenever the cellular telephone 10 is powered up or when the user presses an appropriate key, for example one of the miscellaneous keys 14a-14c.

The display routine illustrated for example in FIG. 13 may be selected at step 6 by, as noted above, either the powering up of the cellular telephone 10 or by the use of an appropriate key. In step 7, the microprocessor 122 will address the battery management circuit 308. As noted above, the battery management circuit 308 provides an accurate account of the available battery charge capacity which may be translated into an "energy remaining" figure or the total amount of charge available. In step 8, the microprocessor 122 will retrieve the average conversation drain and average standby drain parameters which were stored in the static RAM 126 as discussed above with respect to the usage routine illustrated in FIG. 12.

Next, in step 9, the remaining standby and conversation times are computed by dividing the available battery charge (e.g. milliamp-minutes) by the usage, or discharge, rate (e.g. milliamps) to yield the number of minutes available for each of the operating modes of the cellular telephone 10. Finally, in step 10, the computed time values are displayed on the display 12 of the cellular telephone 10.

THE INTERFACE ADAPTER

In accordance with the preferred embodiment, an interface adapter may be used to provide power to the hand held cellular telephone 10 and to provide speakerphone functions. The cellular telephone 10 may be dialed or may receive calls when mounted in the interface adapter and speakerphone functions may be controlled from the cellular telephone.

Figure 14:
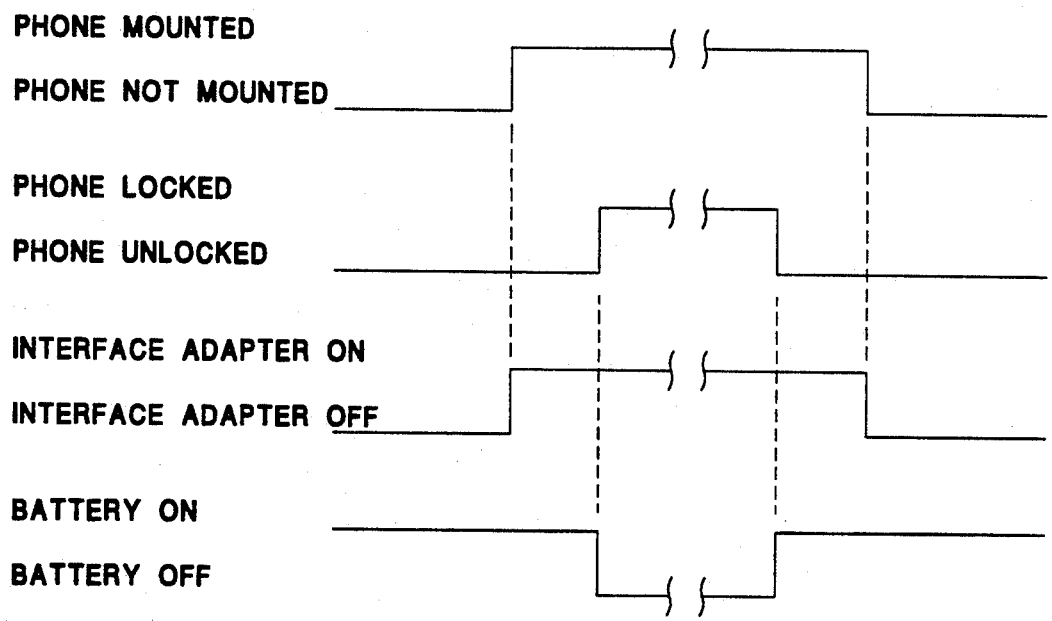
FIG. 14 is a timing chart in accordance with a preferred embodiment of the present invention.

As illustrated in FIG. 14, when the cellular telephone 10 is initially mounted in the interface adapter, i.e. when the cellular telephone is in the "unlocked" position, power is supplied to the cellular telephone by both the battery pack 300 and the interface adapter. Thereafter, when the cellular telephone 10 is "locked" in place, the battery 302 will be switched off. Similarly, when the cellular telephone 10 is returned to the "unlocked" position prior to being removed from the interface adapter, the battery 302 is switched back on while the interface adapter continues to supply power. Accordingly, there is no loss in power to the cellular telephone when the it is placed in, or removed from, the interface adapter.

FIGS. 15-17 illustrate the mechanical aspects of one example of a desktop interface adapter (DIA) 400 in accordance with the present invention. The vehicle interface adapter (VIA) 500 operates mechanically in a substantially similar manner and it is assumed that one skilled in the art would be able to construct VIA based on the following description of the DIA 400. The electrical aspects of the DIA 400 and VIA 500, and their electrical relationship with the cellular telephone 10 and battery 300, are discussed in detail below with reference to FIGS. 18 and 19.

In FIGS. 15a-15d, the cellular telephone 10 has not been placed into the DIA 400, i.e. the DIA 400 is in a "ready to receive" position. No power is supplied by the DIA 400 when it is in the "ready to receive" orientation. The DIA 400 may include a frame 402 and a cradle 404 located within the frame and adapted to support the cellular telephone 10. The cradle 404 may be rotatably mounted on a Din 405 and may be biased forwardly by a spring 406 until it reaches a stopper portion 408 of the frame 402. The DIA 400 may also include a switch 410 which detects when the cellular telephone 10 has been placed in the DIA. Switch 410 is "open" when the DIA 400 is in the "ready to receive" position.

Figure 15B:
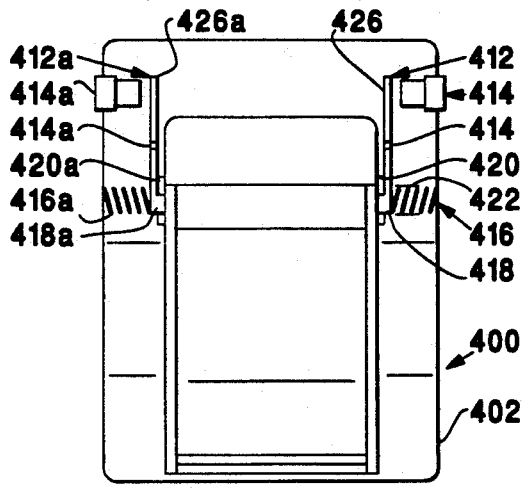
Figure 15C:
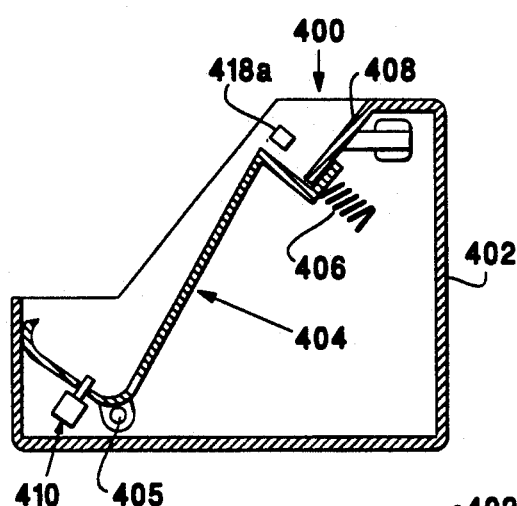
Figure 15A:
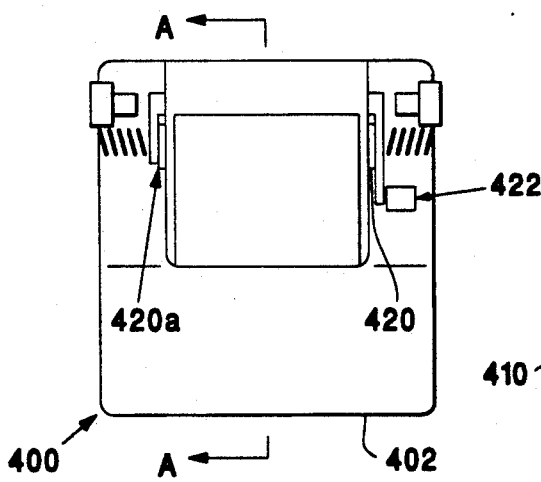
FIG. 15a is a front elevation view of an interface adapter in a "ready to receive" position in accordance with the preferred embodiment of the present invention.
Figure 15D:
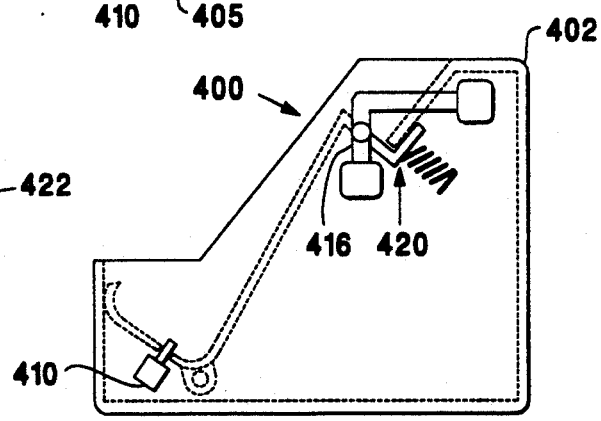

As best seen in FIG. 15b, a pair of lock levers 412 and 412a may be pivotably attached to the frame 402 by pins 414 and 414a. The lock levers 412 and 412a may be used to lock the cellular telephone 10 into the DIA 400. Springs 416 and 416a may be used to bias lock portions 418 and 418a of the lock levers 412 and 412a inwardly towards one another. When the DIA 400 is in the "ready to receive position" illustrated in FIGS. 15a-15d, a pair of stoppers 420 and 420a on the cradle 404 (which is biased forwardly by spring 406) restrict the inward rotation of the lock portions 418 and 418a of lock levers 412 and 412a. Thus, the cellular phone 10 may be placed into the cradle 404 without contacting the lock portions 418 and 418a. A switch 422 on frame 402 detects when the lock portions 418 and 418a have been rotated outwardly away from one another. The switch 422 is "closed" when the DIA 400 is in the "ready to receive" position.

Figure 17B:
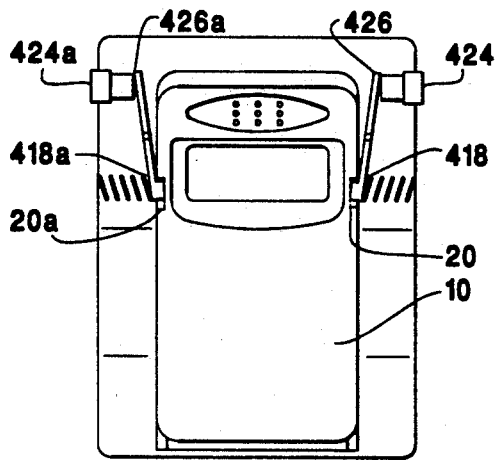
Figure 17C:
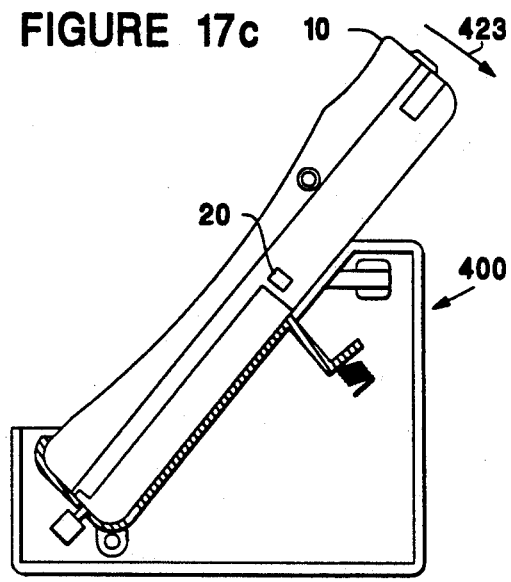
Figure 17A:
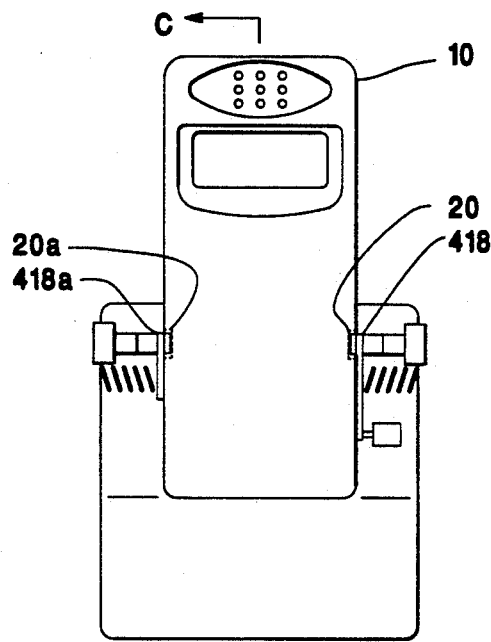
FIG. 17a is a front elevation view of the interface adapter illustrated in FIG. 15a having a cellular telephone mounted therein in a "locked" position.
Figure 17D:
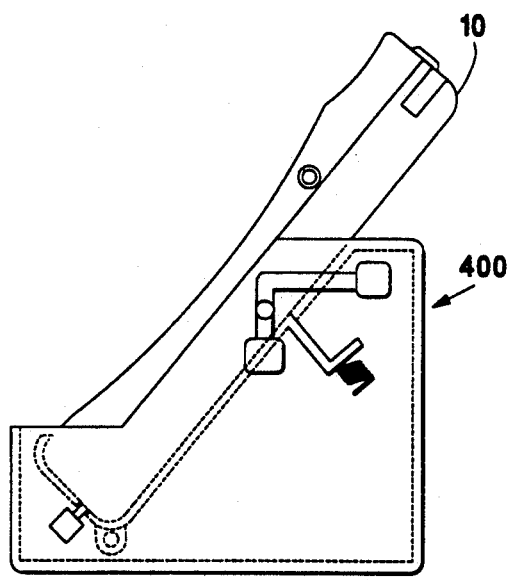

FIGS. 16a-16d shows the cellular telephone 10 mounted in the DIA 400 in an "unlocked" position, i.e. after the cellular telephone has been placed into the cradle 404, but prior to being rotated in the direction of arrow 423 shown in FIG. 17c. Thus, the stoppers 420 and 420a continue to prevent the inward rotation of the lock portions 418 and 418a. The placement of the cellular telephone 10 into the cradle 404 "closes" the switch 410. In response, the DIA 400 begins to supply power to the cellular telephone 10. However, power is also being supplied to the cellular telephone 10 by the battery pack 300.

FIGS. 17a-17d show the cellular telephone in the "locked" position, i.e. where the cellular telephone and cradle 404 have been rotated in the direction of arrow 423 (rearward) to compress the spring 406. The rearward rotation of the cradle 404 cause stoppers 420 and 420a to be moved out of the rotational path of the lock portions 418 and 418a. Accordingly, springs 416 and 416a push lock portions 418 and 418a inwardly into indents 20 and 20a which are located in sides of the cellular telephone 10. The cellular telephone 10 is thus held firmly in place and the spring 406 is prevented from rotating the cradle 404 forwardly. Additionally, the inward rotation of the lock portion 418 allows switch 422 to "open." In response, the battery pack 300 is switched off and the DIA 400 becomes the sole power source for the cellular telephone 10. Additionally, the battery 302 may charged when the cellular telephone 10 is in the "locked position."

Removal of the cellular telephone 10 from the DIA 400 may be accomplished by depressing a pair of release buttons 424 and 424a (FIG. 17b) to inwardly rotate rear portions 426 and 426a of the lock levers 412 and 412a. Correspondingly, the lock portions 418 and 418a rotate outwardly, which allows the spring 406 to force the cradle 404 forward into the position illustrated in FIGS. 16a-16d. The switch 422 will be "closed" by the lock portion 418 and, in response, the battery pack 300 will be switched on. Thus, both the DIA 400 and the battery 302 will be supplying power for the cellular telephone 10. Finally, the cellular telephone 10 may be removed from the cradle 404, allowing the switch 410 to "open." In response, the DIA 400 will stop supplying power.

Figure 18:
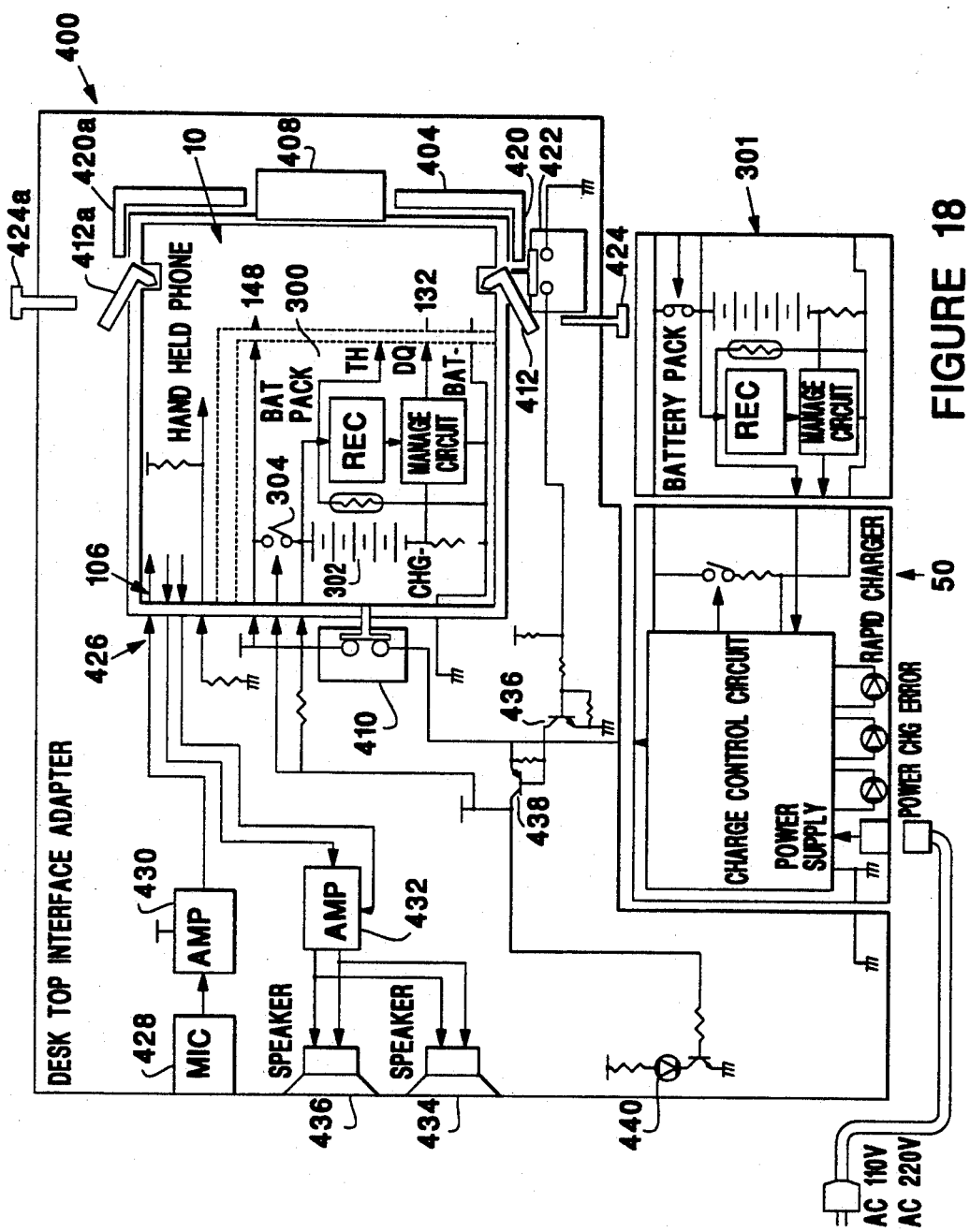
FIG. 18 illustrates electrical connections between a hand held cellular telephone and a desktop interface adapter in accordance with the preferred embodiment of the present invention.
Figure 19:
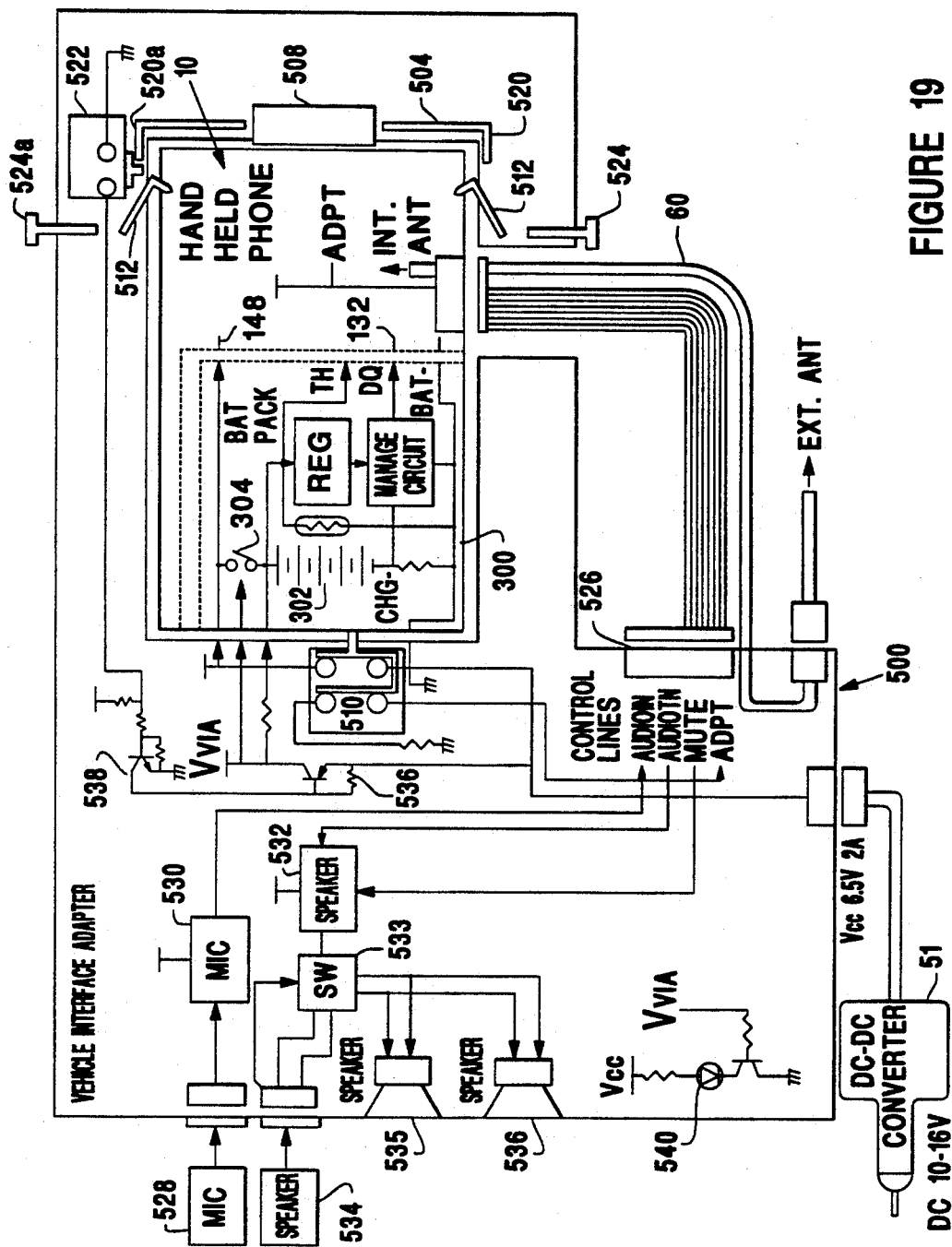
FIG. 19 illustrates electrical connections between a hand held cellular telephone and a vehicle interface adapter in accordance with the preferred embodiment of the present invention.

FIGS. 18 and 19 illustrate the electrical connections between the interface adapter, the battery pack 300 and the cellular telephone 10 in accordance with the preferred embodiment of the present invention. In the preferred embodiment, the electrical connections between the cellular telephone 10 and the interface adapter are made through pins in a base, or bottom, 19 of the cellular telephone.

Illustrated in FIG. 18 is a charger 50, such as a Murata Cellular Charger, which converts AC power to DC power (for example, 6.5 V and 2A) and supplies a charging voltage Vcc to the DIA 400. The charger 50 may also be used to charge a spare battery pack 301. Similarly, FIG. 19 shows a DC to DC converter 51, such as a Murata Vehicle Converter, which converts power from a cigarette lighter to the charging voltage Vcc for supply to the VIA 500.

As illustrated for example in FIG. 18, the DIA microphone 428 and an amplifier 430 may furnish audio signals to the cellular telephone 10 through connectors 426 and 106 during speakerphone operations. However, the microphone 16 (FIG. 1) may be used instead if acoustic conditions so require. Gain may be added to the transmit path by the voice DSP 110 to facilitate the use of either microphone. Audio signals from the cellular telephone 10 may be furnished to a speaker amplifier 432 and speakers 434 and 436 in a similar manner. Speaker volume may be controlled from the cellular telephone 10 by adjusting the volume up/down key 18. In response, gain or loss will be added to the receive path by the voice DSP 110.

As illustrated for example in FIG. 18, when the cellular phone 10 is placed in the cradle 404 and the switch 410 is closed, power is supplied from the DIA 400 to the BAT+ line within the battery pack 300. Such power is passed from the BAT+ line to the connector 148 of the cellular telephone 10. The cellular telephone 10 and the DIA 400 are also connected to the BAT− line within the battery pack 300.

As noted above, the FET switch 304 connects the BAT+ line to the battery 302. The gate of the FET switch 304 is connected to the DET pin. When the cellular telephone 10 is "locked" into the cradle 404 and the switch 422 is "open," transistors 436 and 438 (which are otherwise off) are turned on and a voltage Vdia goes from 0 V to Vcc. When a voltage is applied to the DET pin, the FET switch 304 is turned off and the battery is disconnected from the BAT+ line. Additionally, power is supplied to the CHG+ line to recharge the battery 302. Thus, the DIA 400 may recharge the battery 302 and power the cellular telephone 10 simultaneously. An LED 440 indicates when the cellular telephone 10 is "locked" into the DIA 400.

As illustrated for example in FIG. 19, the VIA 500 may include a cradle 504, a stopper portion 508, lock levers 512 and 512a, stoppers 520 and 520a, and release buttons 524 and 524a, all of which have a structure and function similar to their respective counterparts in the DIA 400. A VIA external microphone 528 and an amplifier 530 may furnish audio signals to the cellular telephone 10 through connectors 526 and 134 during speakerphone operations. However, the microphone 16

(FIG. 1) may be used instead if acoustic conditions so require. Gain may be added to the transmit path by the voice DSP 110 to facilitate the use of either microphone. Audio signals from the cellular telephone 10 may be furnished to a speaker amplifier 532 through a switch 533 to either an external speaker 534 or internal speakers 535 and 536 in a similar manner. Volume may be controlled from the cellular telephone 10 by adjusting the volume up/down key 18. In response, gain or loss will be added to the receive path by the voice DSP 110.

As illustrated for example in FIG. 19, when the cellular phone 10 is placed in a cradle 504 and the switch 510 is closed, power is supplied from the VIA 500 to the BAT+ line within the battery pack 300. Such power is passed from the BAT+ line to the connector 148 of the cellular telephone 10. The cellular telephone 10 and the VIA 500 are also connected to the BAT− line within the battery pack 300.

As noted above, the FET switch 304 connects the BAT+ line to the battery 302. The gate of the FET switch 304 is connected to the DET pin. When the cellular telephone 10 is "locked" into the cradle 504 and the switch 522 is "open," transistors 536 and 538 (which are otherwise off) are turned on and a voltage Vvia goes from 0 V to Vcc. When a voltage is applied to the DET pin, the FET switch 304 is turned off and the battery is disconnected from the BAT+ line. Additionally, power is supplied to the CHG+ line to recharge the battery 302. Thus, the VIA 500 may recharge the battery 302 and power the cellular telephone 10 simultaneously. An LED 540 indicates when the cellular telephone 10 is "locked" into the VIA 500.

Although the present invention has been described in terms of a preferred embodiment above, numerous modifications and/or additions to the above-described preferred embodiment would be readily apparent to one skilled in the art. It is intended that the scope of the present invention extends to all such modifications and/or additions and that the scope of the present invention is limited solely by the claims set forth below.

We claim:

1. An apparatus, comprising:
a cellular telephone including a telephone microphone, a telephone speaker, receiver means for receiving analog signals and digital signals from a base station, transmitter means for transmitting analog signals and digital signals to the base station, a battery pack configured to be mounted within the cellular telephone, the battery pack including a power source, switch means for electrically coupling the power source and the cellular telephone, the switch means configured to be turned off and on, battery state monitoring means for continuously monitoring a state of charge of the power source, determining means, responsive tot he state of charge of the power source, for determining an amount of time remaining for use of the battery pack based on the state of charge, and display means, responsive to the control means, for providing a real time display of the time remaining for use of the battery pack;
interface means for supporting the cellular telephone in at least a locked position and an unlocked position, the interface means including power supply means for supplying power to the cellular telephone when the cellular telephone is being supported by the interface means, an interface microphone, an interface speaker, each of the interface microphone and the interface speaker being operably connected tot he cellular telephone when the cellular telephone is supported by the interface means, the receiver means and the interface speaker defining a receive path, and the transmitter means and one of the telephone microphone and the interface microphone defining a transmit path;
power control means for controlling the switch means to be turned on when the cellular telephone is in the unlocked position and turned off when the cellular telephone is in the locked position;
converter means for converging analog signals received from each of the telephone microphone, the interface microphone and the receiver means into digital signals;
sampling means for sampling digital signals on each of the transmit path and the receive path and for storing values corresponding to a predetermined characteristic of the samples digital signals;
determining means for determining an energy value for the digital signals on each of the transmit path and the receive path over a predetermined period based on the stored values of the predetermined characteristic;
switching means for switching off one of the transmit path and the receive path in response to the determined energy values;
memory means for storing digital signals;
memory record means for storing digital signals from the receiving means and from the converter means in the memory means; and
memory playback means for transferring digital signals stored int he memory means to the transmitter means and for converging digital signals from the memory means into analog signals ad transferring the analog signals to one of the telephone speaker, the interface speaker and the transmitter means.

* * * * *